(12) United States Patent
Carson

(10) Patent No.: US 12,222,039 B2
(45) Date of Patent: Feb. 11, 2025

(54) GUIDED FLOW VALVE ASSEMBLY AND SYSTEM INCORPORATING SAME

(71) Applicant: Ichor Systems, Inc., Fremont, CA (US)

(72) Inventor: Stephen Carson, Woodstock, NY (US)

(73) Assignee: Ichor Systems, Inc.

( * ) Notice: Subject to any disclaimer, the term of this patent is extended or adjusted under 35 U.S.C. 154(b) by 0 days.

(21) Appl. No.: 17/697,038

(22) Filed: Mar. 17, 2022

(65) Prior Publication Data

US 2022/0299118 A1    Sep. 22, 2022

Related U.S. Application Data

(60) Provisional application No. 63/164,139, filed on Mar. 22, 2021.

(51) Int. Cl.
| | | |
|---|---|---|
| *F16K 1/54* | (2006.01) | |
| *F16K 1/38* | (2006.01) | |
| *F16K 41/12* | (2006.01) | |
| *H01L 21/67* | (2006.01) | |

(52) U.S. Cl.
CPC .................. *F16K 1/54* (2013.01); *F16K 1/38* (2013.01); *F16K 41/12* (2013.01); *H01L 21/67017* (2013.01)

(58) Field of Classification Search
CPC ..... F16K 1/54; F16K 1/38; F16K 1/36; F16K 41/12; F16K 31/1266; F16K 41/103; F16K 41/125; H01L 21/60717
USPC .................................. 251/127, 205, 359–360
See application file for complete search history.

(56) References Cited

U.S. PATENT DOCUMENTS

| | | | | |
|---|---|---|---|---|
| 1,304,724 A | * | 5/1919 | Young ....................... | F16K 3/26 137/625.38 |
| 2,014,314 A | * | 9/1935 | Defenbaugh ......... | E21B 34/025 251/359 |
| 3,187,775 A | * | 6/1965 | Pinnell ..................... | F16K 1/52 137/903 |
| 3,511,470 A | * | 5/1970 | Beckett .................... | F16K 1/52 137/454.6 |

(Continued)

FOREIGN PATENT DOCUMENTS

| CN | 104248886 B | 5/2016 |
|---|---|---|
| CN | 208634481 U | 3/2019 |

(Continued)

OTHER PUBLICATIONS

International Search Report and the Written Opinion of PCT/US2022/20709 Issued on Aug. 2, 2022.

*Primary Examiner* — Craig J Price
*Assistant Examiner* — Andrew J Rost
(74) *Attorney, Agent, or Firm* — The Belles Group, P.C.

(57) ABSTRACT

Apparatuses for controlling fluid flow are important components for delivering process fluids for semiconductor fabrication. These apparatuses for controlling fluid flow frequently rely on valves which can provide flows at different rates and in a minimally turbulent manner. In one embodiment, a valve assembly is disclosed, the valve assembly having a valve body, a closure member, a seat, and a radial flow guide. The radial flow guide has a plurality of flow passages. The closure member has a needle, the needle having a plurality of grooves therein. The resulting valve assembly enables improved control of fluid and reduces turbulence in the resultant flow.

23 Claims, 34 Drawing Sheets

(56) References Cited

U.S. PATENT DOCUMENTS

| | | | |
|---|---|---|---|
| 3,746,305 A * | 7/1973 | Zakka | F16K 1/422 |
| | | | 251/360 |
| 3,762,685 A | 10/1973 | Curran | |
| 3,791,413 A | 2/1974 | Muller et al. | |
| 3,971,411 A | 7/1976 | Baumann | |
| 4,157,808 A * | 6/1979 | Eidsmore | F16K 47/04 |
| | | | 251/205 |
| 4,249,574 A | 2/1981 | Schnall et al. | |
| 4,671,321 A | 6/1987 | Paetzel et al. | |
| 5,163,476 A | 11/1992 | Wessman | |
| 5,318,270 A | 6/1994 | Detanne | |
| 5,516,079 A * | 5/1996 | Baumann | F16K 31/126 |
| | | | 137/625.3 |
| 5,575,311 A | 11/1996 | Kingsford | |
| 5,618,025 A * | 4/1997 | Barron | F16K 1/52 |
| | | | 251/210 |
| 5,765,814 A | 6/1998 | Dvorak | |
| 5,941,505 A * | 8/1999 | Nagel | F16K 41/12 |
| | | | 137/559 |
| 5,964,248 A * | 10/1999 | Enarson | F16K 47/04 |
| | | | 137/625.37 |
| 6,000,416 A | 12/1999 | Kingsford et al. | |
| 6,095,186 A * | 8/2000 | Nagel | F16K 1/427 |
| | | | 251/210 |
| 6,250,330 B1 | 6/2001 | Welker | |
| 6,293,514 B1 | 9/2001 | Pechoux et al. | |
| 6,464,201 B2 | 10/2002 | Job | |
| 6,807,984 B2 | 10/2004 | Volovets | |
| 6,926,249 B2 | 8/2005 | Erickson et al. | |
| 6,953,056 B1 * | 10/2005 | Chrisp | F16K 1/36 |
| | | | 137/625.33 |
| 7,000,895 B2 * | 2/2006 | Gessaman | F16K 31/0693 |
| | | | 251/282 |
| 7,104,281 B2 * | 9/2006 | Stares | F16K 3/246 |
| | | | 137/625.33 |
| 7,152,628 B2 * | 12/2006 | Folk | F16K 47/04 |
| | | | 137/625.33 |
| 7,712,484 B2 * | 5/2010 | Fukano | F16K 31/1221 |
| | | | 137/881 |
| 7,721,753 B2 * | 5/2010 | Wears | F16K 1/48 |
| | | | 137/315.27 |
| 7,748,401 B2 * | 7/2010 | Zecchi | G05D 16/0647 |
| | | | 137/906 |
| 7,789,105 B2 * | 9/2010 | Zecchi | G05D 16/0658 |
| | | | 137/625.33 |
| 8,522,820 B2 | 9/2013 | Biwanski et al. | |
| 8,740,179 B2 * | 6/2014 | Griffin, Jr. | F16K 47/08 |
| | | | 251/360 |
| 8,863,776 B2 * | 10/2014 | Grace | F16K 47/08 |
| | | | 137/625.33 |
| 9,038,664 B2 | 5/2015 | McCarty et al. | |
| 9,518,662 B2 * | 12/2016 | Doran | F16K 1/32 |
| 9,739,381 B2 * | 8/2017 | Bouvry | F16K 1/46 |
| 10,359,128 B2 * | 7/2019 | Griffin, Jr. | F16K 47/08 |
| 10,969,025 B2 * | 4/2021 | Matsuzawa | F16K 7/12 |
| 2006/0037644 A1 | 2/2006 | Nishikawa et al. | |
| 2012/0103440 A1 | 5/2012 | Chizek et al. | |
| 2014/0346385 A1 | 11/2014 | Hasunuma | |
| 2018/0216745 A1 * | 8/2018 | Gabriel | F16K 1/36 |
| 2020/0355291 A1 * | 11/2020 | Inoue | F16K 1/36 |

FOREIGN PATENT DOCUMENTS

| | | |
|---|---|---|
| CN | 210770346 U | 6/2020 |
| CN | 211951487 U | 11/2020 |
| GB | 1561159 A | 2/1980 |
| JP | 4160010 B2 | 10/2008 |
| WO | 9949252 A1 | 9/1999 |

* cited by examiner

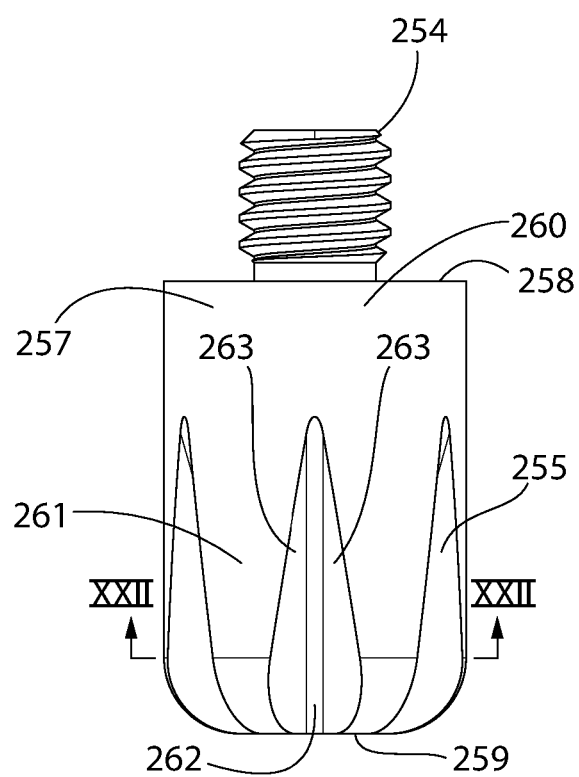 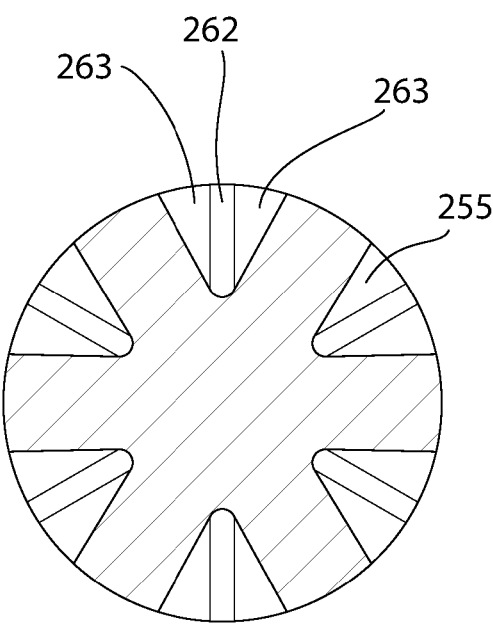
FIG. 21
FIG. 22

GUIDED FLOW VALVE ASSEMBLY AND SYSTEM INCORPORATING SAME

CROSS-REFERENCE TO RELATED APPLICATIONS

This application claims the benefit of U.S. Provisional Application 63/164,139, filed Mar. 22, 2021, which is incorporated herein by reference in its entirety.

BACKGROUND OF THE INVENTION

Flow control has been one of the key technologies in semiconductor chip fabrication. Apparatuses for controlling fluid flow are important for delivering known flow rates of process fluids for semiconductor fabrication and other industrial processes. Such devices are used to measure and accurately control the flow of fluids for a variety of applications. This control relies on valve assemblies which deliver precise flow rates with a minimum of turbulence.

As the technology of chip fabrication has improved, so has the demand on the apparatuses for controlling flow. Semiconductor fabrication processes increasingly require increased performance, including more accurate measurements, lower equipment costs, improved transient response times, and more consistency in timing in the delivery of gases. In order to improve the consistency in gas and liquid delivery, improved valve assemblies are desired.

SUMMARY OF THE INVENTION

The present technology is directed to a valve assembly for use in a mass flow controller or other gas or liquid delivery device. One or more of these gas or liquid delivery devices may be used in a wide range of processes such as semiconductor chip fabrication, solar panel fabrication, etc.

In one implementation, the invention is a system for processing articles. The system has a fluid supply configured to supply a process fluid, and an apparatus for controlling flow. The apparatus for controlling flow has an inlet, an outlet, and a valve assembly, the inlet of the apparatus fluidly coupled to the fluid supply and the valve assembly fluidly coupled between the inlet and the outlet. The valve assembly has a body, a seat, a closure member, an actuator, a radial flow guide, and a longitudinal axis. The body of the valve assembly has an inlet and an outlet, a flow path extending between the inlet and the outlet. The seat is located in the flow path. The closure member is configured to engage the seat and obstruct the flow path. The actuator assembly is coupled to the closure member to move the closure member from a closed state which obstructs the flow path to an open state which permits fluid flow. The radial flow guide is located in the flow path. The longitudinal axis extends through the seat, the closure member, and the radial flow guide. The system further has an outlet manifold fluidly coupled to the outlet of the apparatus and a processing chamber fluidly coupled to the outlet manifold.

In another implementation, the invention is an apparatus for controlling flow. The apparatus for controlling flow has an inlet an outlet and a valve assembly, the valve assembly fluidly coupled between the inlet and the outlet. The valve assembly has a body, a seat, a closure member, an actuator, a radial flow guide, and a longitudinal axis. The body of the valve assembly has an inlet and an outlet, a flow path extending between the inlet and the outlet. The seat is located in the flow path. The closure member is configured to engage the seat and obstruct the flow path. The actuator assembly is coupled to the closure member to move the closure member from a closed state which obstructs the flow path to an open state which permits fluid flow. The radial flow guide is located in the flow path. The longitudinal axis extends through the seat, the closure member, and the radial flow guide.

In yet another implementation, the invention is a valve assembly. The valve assembly has a body, a seat, a closure member, an actuator, a radial flow guide, and a longitudinal axis. The body of the valve assembly has an inlet and an outlet, a flow path extending between the inlet and the outlet. The seat is located in the flow path. The closure member is configured to engage the seat and obstruct the flow path. The actuator assembly is coupled to the closure member to move the closure member from a closed state which obstructs the flow path to an open state which permits fluid flow. The longitudinal axis extends through the seat, the closure member, and the radial flow guide.

In another implementation, the invention is a method of manufacturing articles. The method involves providing an apparatus for controlling flow of a process fluid, the apparatus for controlling flow having a valve assembly, the valve assembly having a body having an inlet and an outlet and a flow path extending between the inlet and the outlet. A seat is located in the flow path. A closure member is configured to engage the seat and obstruct the flow path. An actuator assembly is coupled to the closure member to move the closure member from a closed state which obstructs the flow path to an open state which permits fluid flow. A radial flow guide is located in the flow path. A longitudinal axis extends through the seat, the closure member, and the radial flow guide. A process fluid is supplied to the apparatus for controlling flow. The process fluid is flowed through the valve assembly of the apparatus for controlling flow to an outlet of the apparatus for controlling flow. The outlet of the apparatus for controlling flow is fluidly coupled to an outlet manifold. The process fluid is delivered from the outlet of the apparatus for controlling flow to a processing chamber fluidly coupled to the outlet manifold. Finally, a process is performed on an article within the processing chamber.

In yet another implementation, the invention is a system for processing articles. The system has a fluid supply configured to supply a process fluid and an apparatus for controlling flow. The apparatus for controlling flow has an inlet, an outlet, and a valve assembly, the inlet of the apparatus fluidly coupled to the fluid supply and the valve assembly fluidly coupled between the inlet and the outlet. The valve assembly has a body, a seat, a closure member, an actuator, and a longitudinal axis. The body of the valve assembly has an inlet and an outlet, a flow path extending between the inlet and the outlet. The seat is located in the flow path. The closure member is configured to engage the seat and obstruct the flow path. The closure member has a diaphragm and a needle, the needle having a top end, a bottom end, a cylindrical portion, and a grooved portion. The grooved portion extends from the bottom end to the cylindrical portion and the grooved portion has a plurality of grooves. The actuator assembly is coupled to the closure member to move the closure member from a closed state which obstructs the flow path to an open state which permits fluid flow. The longitudinal axis extends through the seat and the closure member. The system further has an outlet manifold fluidly coupled to the outlet of the apparatus and a processing chamber fluidly coupled to the outlet manifold.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein:

FIG. 21 is a front view of the needle of the valve assembly of FIG. 11.

FIG. 22 is a cross-sectional view of the needle of FIG. 21, taken along line XXII-XXII.

DETAILED DESCRIPTION

Figure 1:
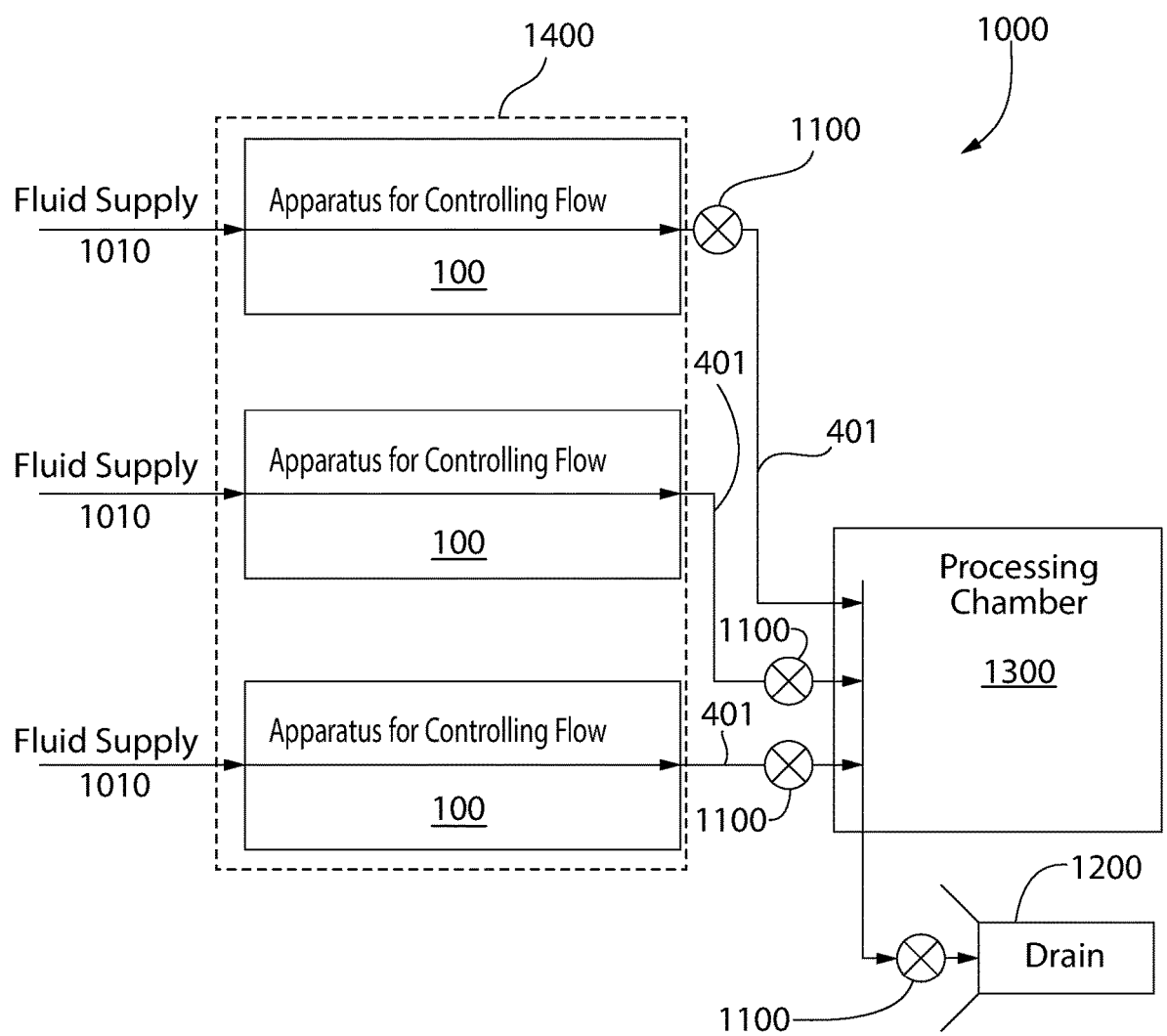
FIG. 1 is a schematic of a system for manufacturing semiconductor devices utilizing one or more apparatuses for controlling flow.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to a valve assembly for use in an apparatus for controlling fluid flow. In some embodiments, the apparatus may function as a mass flow controller to deliver a known mass flow of fluid to a semiconductor process or similar process. Semiconductor fabrication is one industry which demands high performance in control of fluid flows. As semiconductor fabrication techniques have advanced, customers have recognized the need for flow control devices with increased accuracy and repeatability in the mass of the delivered fluid flows. Modern semiconductor processes require that the mass of the gas flow is tightly controlled, the response time minimized, and the fluid flow is highly accurate. The present invention reduces turbulence in the delivered flows.

FIG. 1 shows a schematic of an exemplary processing system 1000. The processing system 1000 may utilize a plurality of apparatus for controlling flow 100 fluidly coupled to a processing chamber 1300. The plurality of apparatus for controlling flow 100 are used to supply one or more different process fluids to the processing chamber 1300. Fluids are provided by a plurality of fluid supplies 1010. As can be seen, two or more fluid supplies 1010 can be connected to a single apparatus for controlling flow 100. Collectively, the plurality of apparatus for controlling flow 100 belong to a fluid delivery module 1400. Optionally, more than one fluid delivery module 1400 may be utilized in the processing system 100. The plurality of apparatus for controlling flow 100 are connected to the processing chamber 1300 by an outlet manifold 401. Articles such as semiconductors and integrated circuits may be processed within the processing chamber 1300.

Valves 1100 isolate each of the apparatus for controlling flow 100 from the processing chamber 1300, enabling each of the apparatus for controlling flow 100 to be selectively connected or isolated from the processing chamber 1300, facilitating a wide variety of different processing steps. The processing chamber 1300 may contain an applicator to apply process fluids delivered by the plurality of apparatus for controlling flow 100, enabling selective or diffuse distribution of the fluids supplied by the plurality of apparatus for controlling flow 100. Optionally, the processing chamber 1300 may be a vacuum chamber or may be a tank or bath for immersing articles in the fluids supplied by the plurality of apparatus for controlling flow 100. A fluid supply line is formed by the flow path from each of the respective fluid supplies to the processing chamber 1300.

In addition, the processing system 1000 may further comprise a vacuum source or drain 1200 which is isolated from the processing chamber 1300 by a valve 1100 to enable evacuation of process fluids or facilitate purging one or more of the apparatus for controlling flow 100. This enables maintenance, switching between process fluids in the same apparatus for controlling flow 100, or other tasks. Optionally, the drain 1200 may be a liquid drain configured to remove liquids from the processing chamber 1300. Alternately, the drain 1200 may be a vacuum source for removing gases. Optionally, the apparatus for controlling flow 100 may be mass flow controllers, flow splitters, flow combiners, or any other device which controls the flow of a process fluid in a processing system. Furthermore, the valves 1100 may be integrated into the apparatus for controlling flow 100 if so desired. The processing chamber 1300 may house a semiconductor wafer for processing, among other articles.

Processes that may be performed in the processing system 1000 may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, or any other process utilizing controlled volumes of a process gas.

Figure 2:
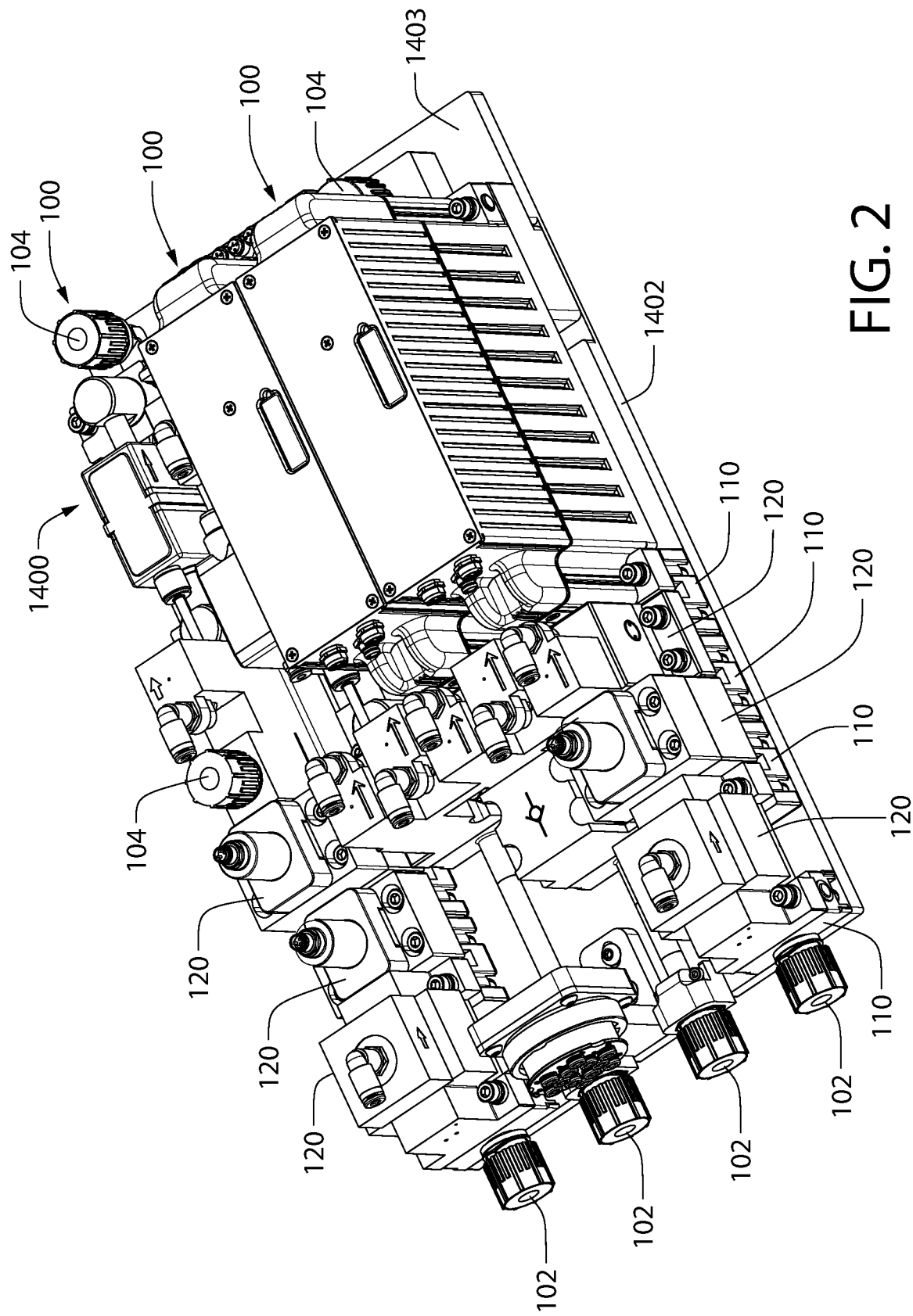
FIG. 2 is a perspective view of a fluid delivery module comprising a plurality of apparatuses for controlling flow as may be utilized in the process of FIG. 1.

FIG. 2 shows an exemplary fluid delivery module 1400 comprising a plurality of apparatus for controlling flow 100. The fluid delivery module 1400 comprises a support structure 1402. The support structure 1402 may be referred to as a base substrate or base plate and is generally a flat plate or sheet with one or more apparatuses for controlling flow 100 mounted thereon. In the present example, a plurality of apparatus for controlling flow 100 are mounted to the support structure. Each of the apparatus for controlling flow 100 are modular in design, and comprise a large number of individual fluid flow components 110, 120 which are each attached to the support structure 1402 either directly or indirectly. The support structure 1402 has a top surface 1403 onto which the apparatuses for controlling flow 100 are mounted.

Fluid flow components 110, 120 include active flow components 120 and passive flow components 110. Passive flow components 110 do not alter the flow of the fluid, but instead merely connect one active component to another or connect an active component to an inlet or outlet. Active flow components 120 may alter the flow of fluid, monitor an aspect of the fluid, or otherwise perform a function beyond mere fluid conveyance. Active flow components 120 may include temperature sensors, pressure transducers, mass flow controllers, valves, and the like. Yet other components may be both active and passive depending on their current use in an apparatus for controlling flow 100. For instance, a temperature sensor may also serve as a passive fluid flow component which conveys fluid from one active flow component 120 to another and may not actually be utilized to measure temperature sensor. As can be seen, a huge number of variations in fluid flow components 110, 120 can be conceived, and these fluid flow components 110, 120 can be used to assemble a wide range of apparatus for controlling flow 100.

The fluid delivery module 1400 comprises a plurality of inlets 102 which receive fluid from the fluid supplies 1010 discussed above. The fluid delivery module also has at least one outlet 104 which delivers fluid to the processing chamber 1300. Each apparatus for controlling flow 100 may have one inlet 102 and one outlet 104 or may have a plurality of inlets 102 or a plurality of outlets 104. Thus, fluid may flow through a plurality of inlets 102 and be delivered via a single outlet 104 or may flow through a single inlet 102 and be delivered via a plurality of outlets 104. The same fluid may be delivered to a plurality of inlets 102 or different fluids may be delivered to each inlet 102. The same inlet 102 or outlet 104 may be shared by a plurality of apparatus for controlling flow 100 or each apparatus for controlling flow 100 may have one or more dedicated inlets 102 and outlets 104.

Figure 3:
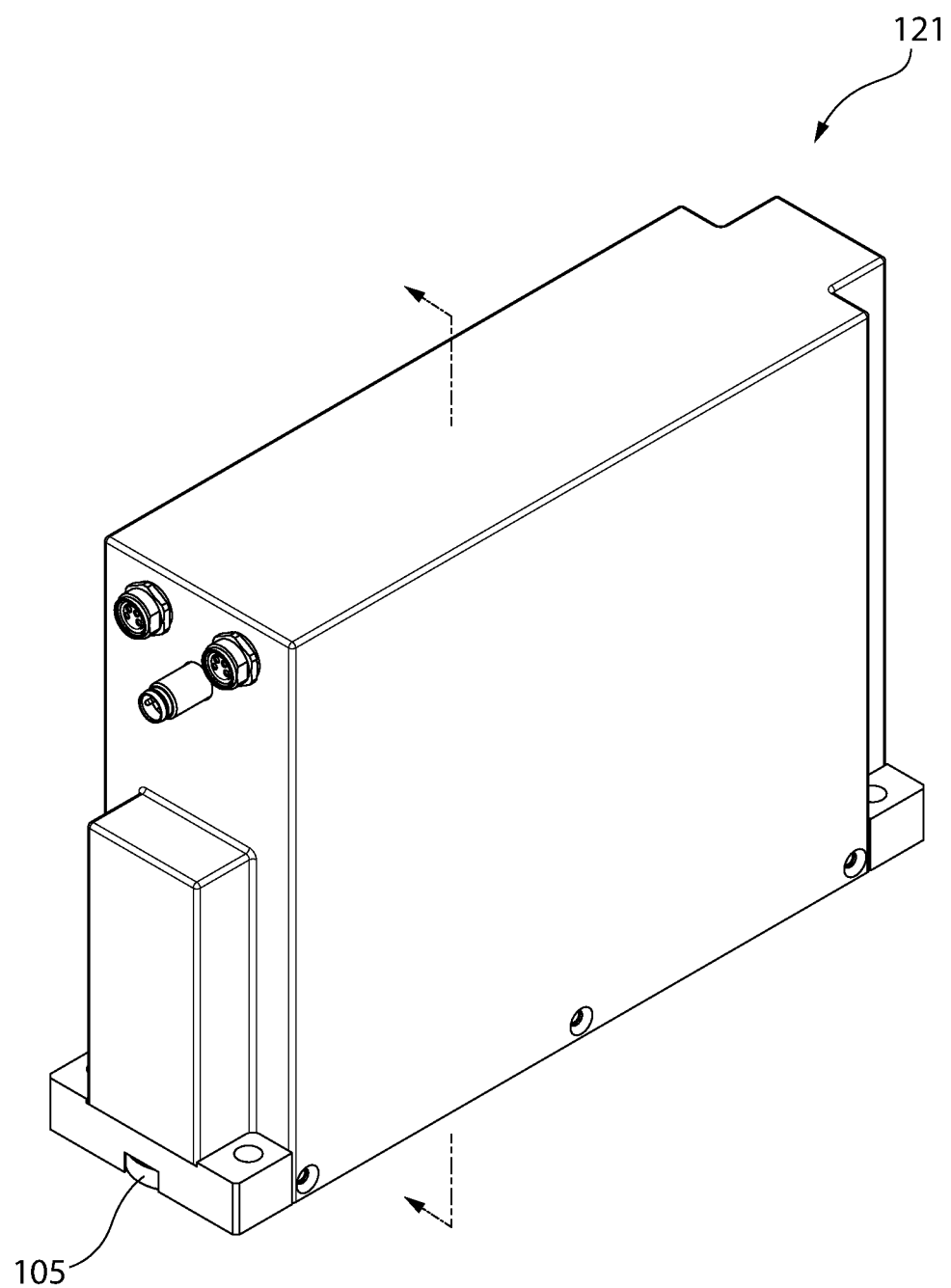
FIG. 3 is a perspective view of a flow component as may be utilized in the fluid delivery module of FIG. 2.
Figure 4:
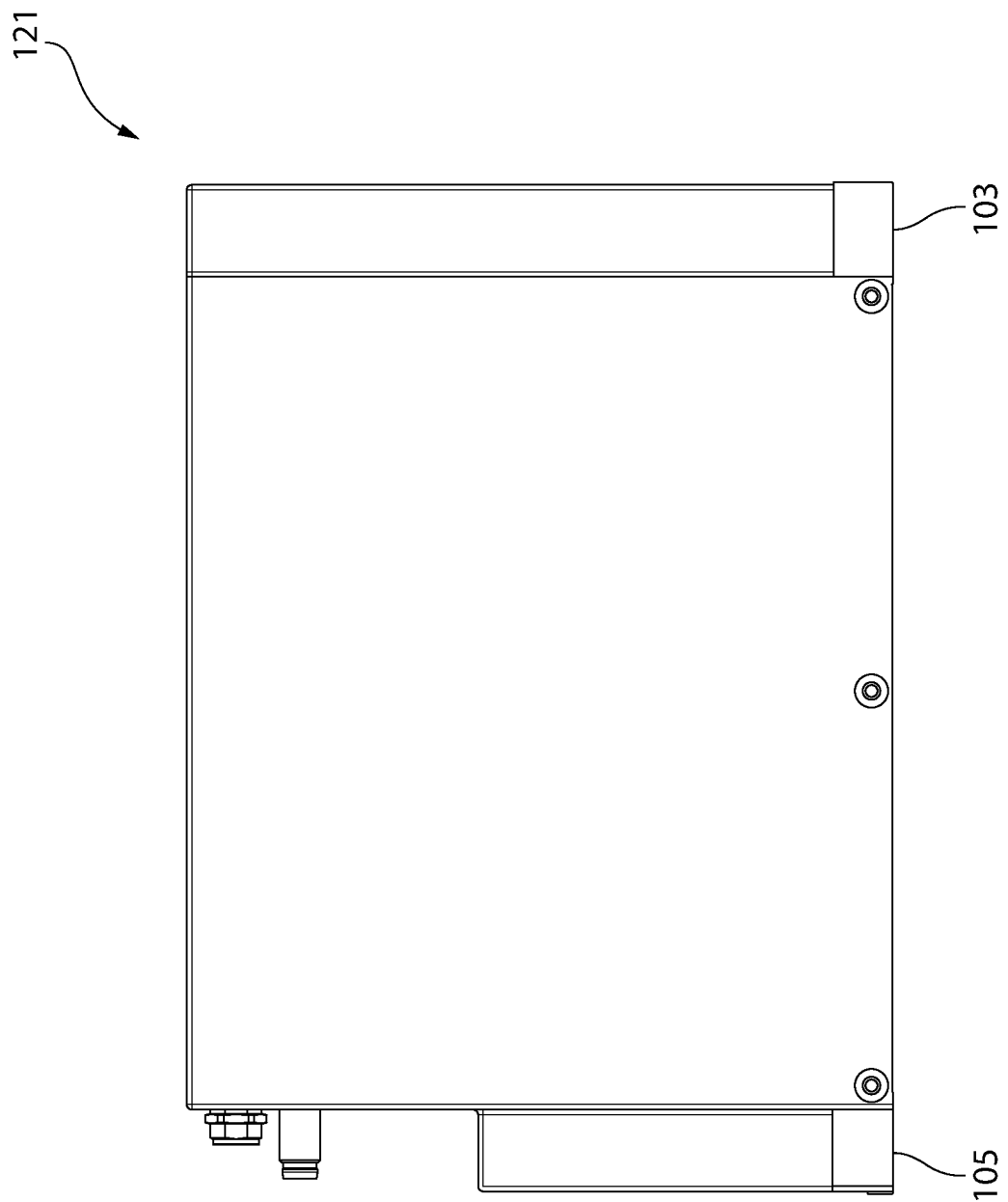
FIG. 4 is a left side view of the flow component of FIG. 2.
Figure 5:
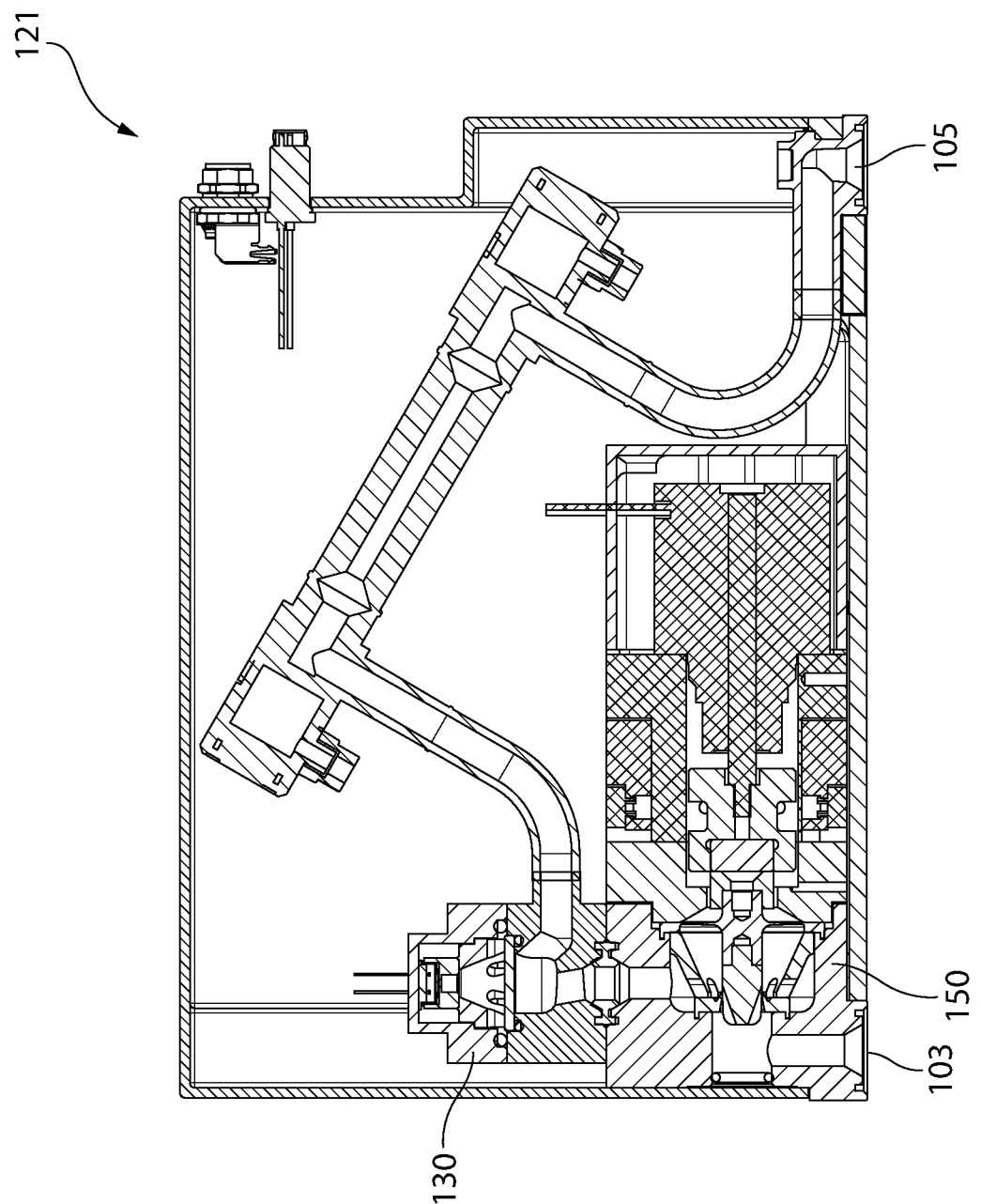
FIG. 5 is a cross-sectional view of the flow component of FIG. 3, taken along line V-V.

Turning to FIGS. 3-5, an embodiment of a fluid flow component 121 is shown in greater detail. The fluid flow component 121 comprises an inlet 103, a valve 150, a transducer 130, and an outlet 105. Fluid flows from the inlet 103 to the outlet 105, but in other embodiments the fluid may flow in the opposite direction. The fluid flow component 121 may comprise sub-components such as the valve assemblies discussed in detail below. Furthermore, the fluid flow component 121 may form an apparatus for controlling flow 100 or it may be a single component among many within an apparatus for controlling flow 100. As can be seen, a wide range of apparatus for controlling flow 100 can be assembled from a wide variety of component assemblies. This allows reconfiguration of components to provide a range of different apparatus for controlling flow 100, each apparatus for controlling flow 100 serving a different purpose.

Figure 6:
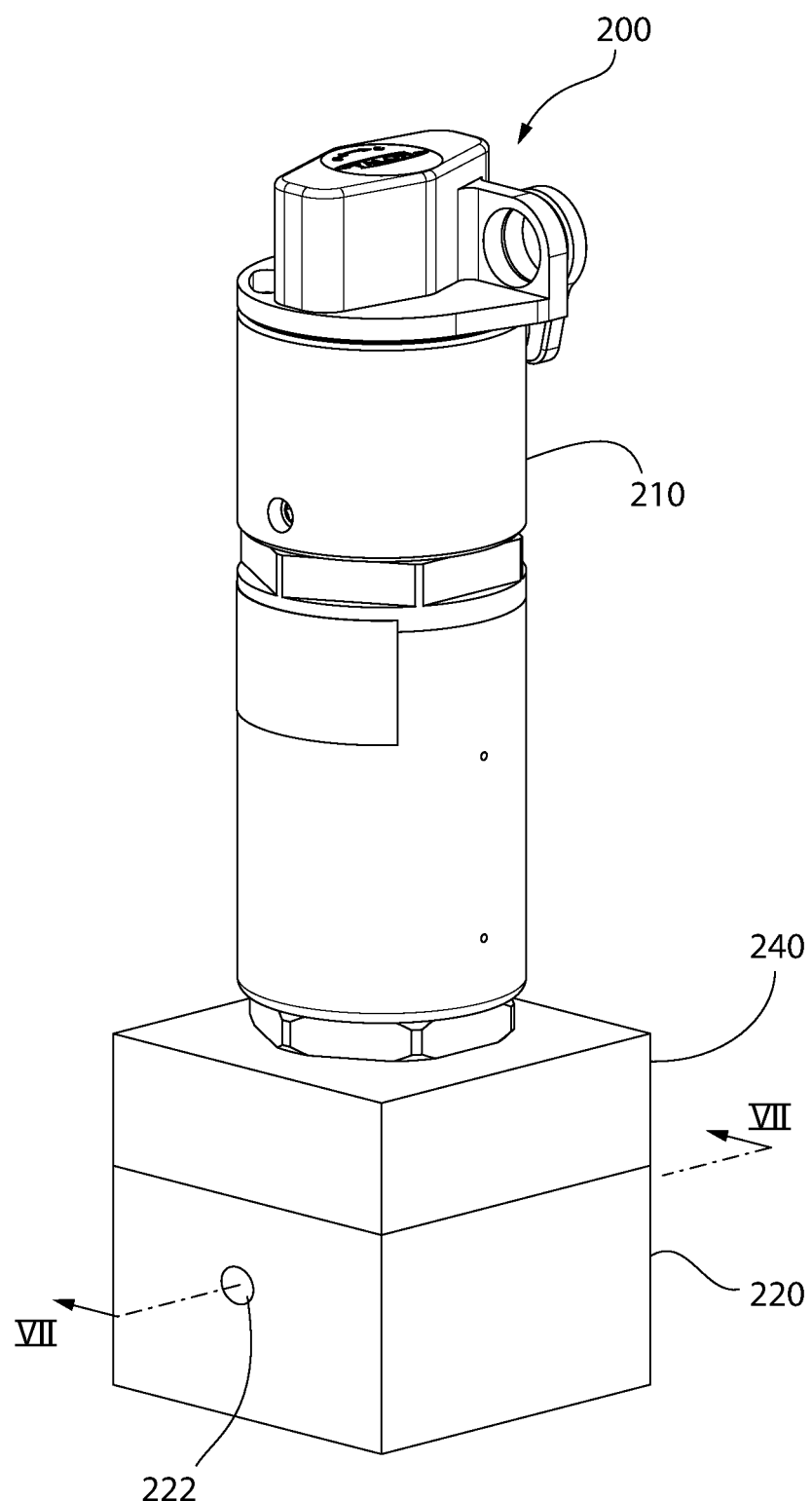
FIG. 6 is a perspective view of a valve assembly as may be utilized in the flow component of FIG. 3.
Figure 7:
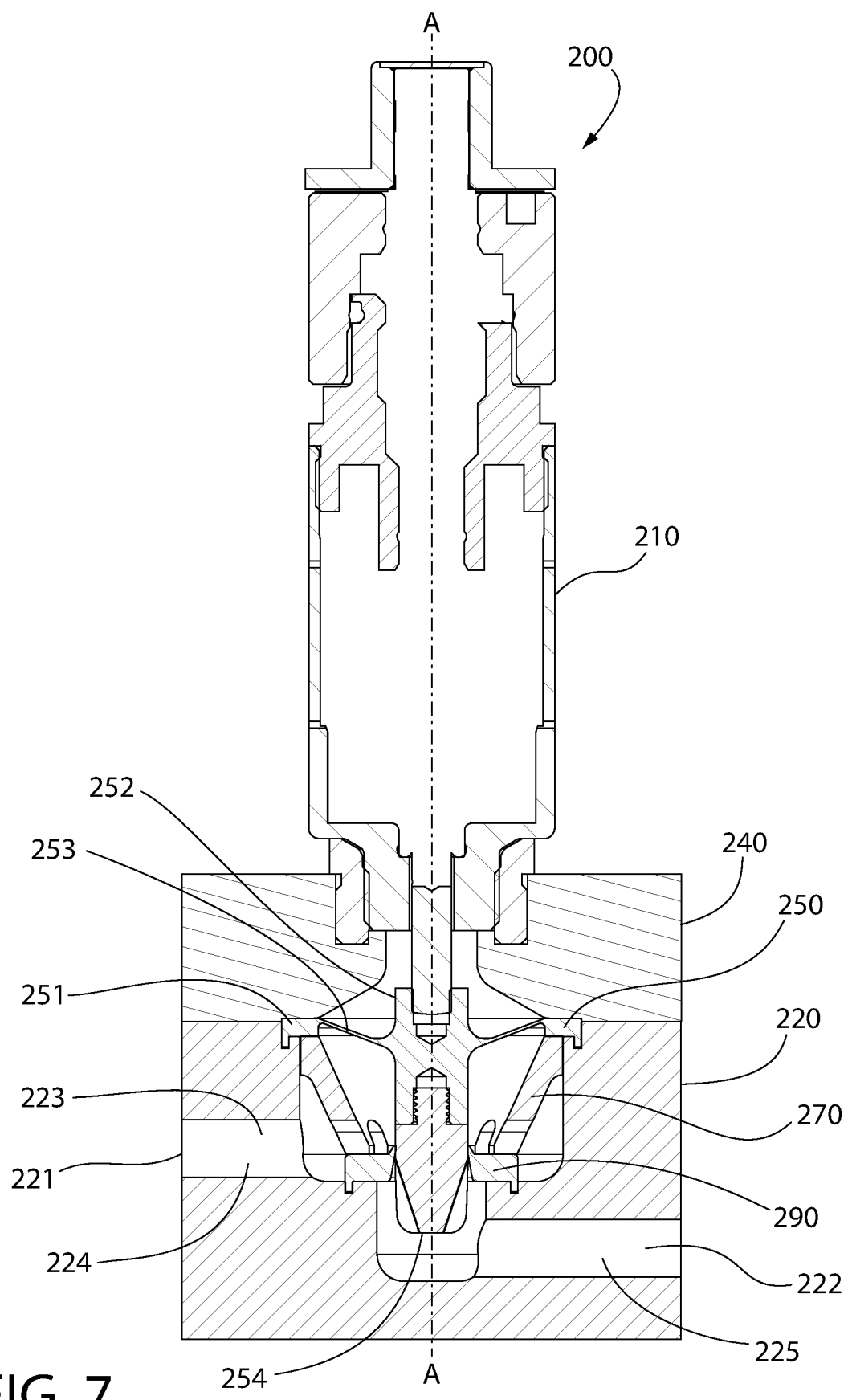
FIG. 7 is a cross-sectional view of the valve assembly of FIG. 6 when the valve assembly is in the closed state, taken along line VII-VII.
Figure 8:
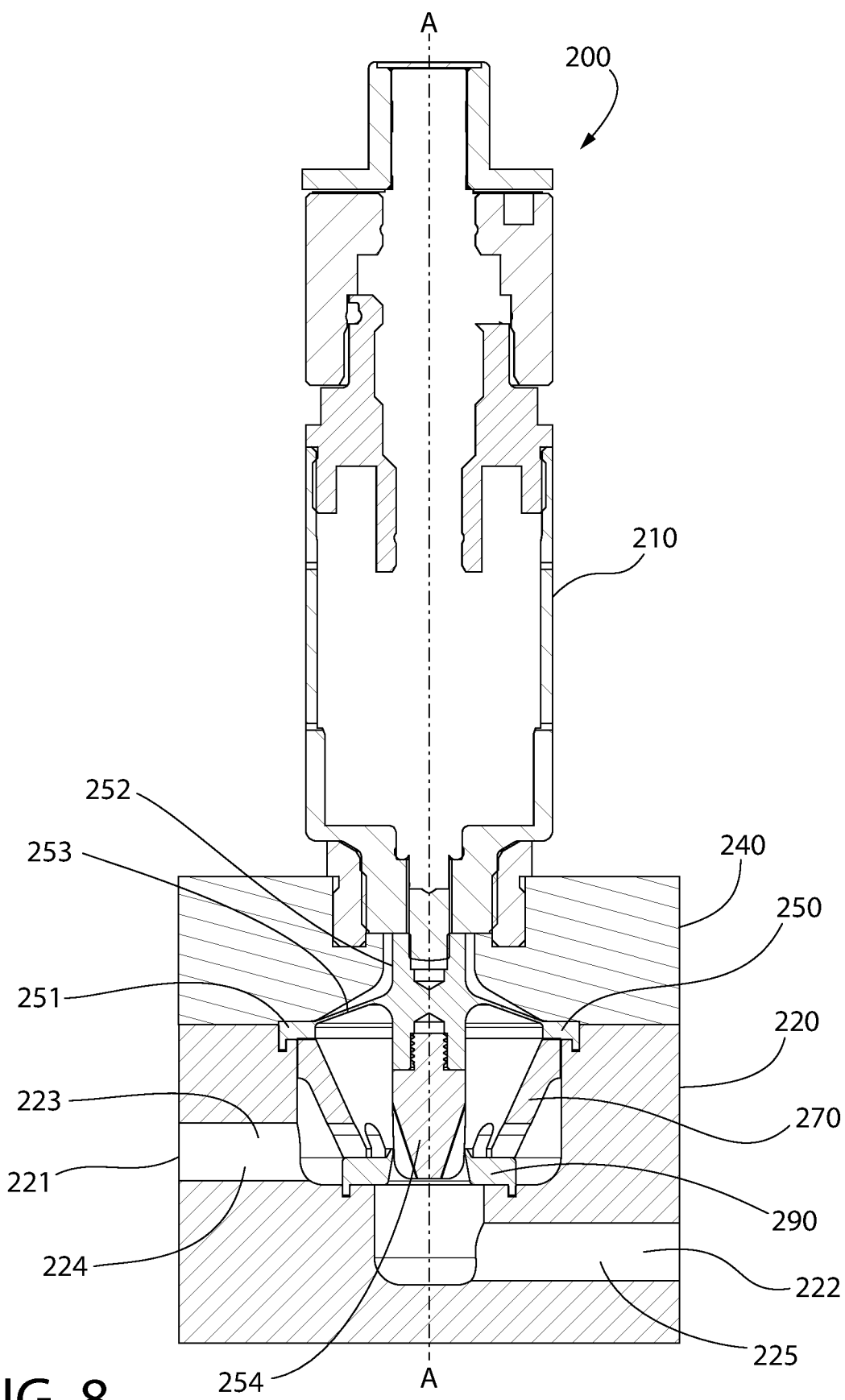
FIG. 8 is a cross-sectional view of the valve assembly of FIG. 6 when the valve assembly is in the open state, taken along line VII-VII.

FIGS. 6-8 show a valve assembly 200 as may be utilized in the fluid flow component 121 discussed above. FIG. 6 shows a perspective view of the valve assembly 200, the valve assembly 200 comprising an actuator assembly 210, a valve body 220, and a cover 240. The valve assembly 200 may be an on/off valve, a proportional valve, or any other known type of valve. The valve assembly 200 transitions from an open state to a closed state. Otherwise stated, the valve assembly 200 transitions from an open position to a closed position. Optionally, the valve assembly 200 may also be operated in any number of intermediate states between the open state and the closed state. For instance, the valve assembly 200 may be a proportional valve capable of providing a range of flow between the open state and the closed state. In the open state, fluid is free to flow through the valve assembly 200. In the closed state, fluid is blocked from flowing through the valve assembly 200. The valve assembly 200 may also permit flow at all intermediate states between the open state and the closed state. Optionally, the valve body 220 may be an integrally formed monolithic component. The valve assembly 200 may be one of a plurality of components that collectively form an apparatus for controlling flow 100.

Turning to FIGS. 7 and 8, the internal components of the valve assembly 200 are shown in cross-sectional views. The valve assembly 200 further comprises a longitudinal axis A-A, a closure member 250, a radial flow guide 270, a seat 290, an inlet 221, and an outlet 222 as best seen in FIGS. 7 and 8. The closure member 250 is configured to flex or otherwise move such that it can engage the seat 290 to control fluid flow through the valve body 220. Thus, fluid flows into the valve assembly 200 at the inlet 221, past the closure member 250 and the seat 290, and out of the outlet 222.

The actuator assembly 210 serves to move the closure member 250. The actuator assembly 210 may be operated electrically, pneumatically, hydraulically, or through any other known means. The actuator assembly 210 may be biased into the open state or the closed state via a spring or other biasing means. The actuator assembly 210 may also incorporate more than one operation means, such as pneumatic and electric operation. The actuator assembly 210 typically has a movable element which is attached to the closure member via threads. In other embodiments, the closure member may be attached to the movable element of the actuator assembly 210 by welding, brazing, gluing, compression fitting, pinning, or any other known means.

The body 220 of the valve assembly 200 comprises the inlet 221 and the outlet 222. The inlet 221 extends to the outlet 222 along a flow path 223. The flow path 223 comprises all internal volume of the body 220 of the valve assembly 200 not occupied by the closure member 250, the radial flow guide 270, or the seat 290. The flow path 223 is divided into a first volume 224 and a second volume 225. The first volume 224 comprises all internal volume of the flow path 223 from the inlet to the seat 290, while the second volume 225 comprises all internal volume of the flow path 223 from the seat 290 to the outlet 222. Thus, the first volume 224 is upstream of the seat 290 while the second volume 225 is downstream of the seat 290. However, in some embodiments or implementations, the valve assembly 200 may flow fluid in both directions. The terminology above is used to reflect the most probable direction of fluid flow and aid in better understanding the workings of the valve assembly 200.

The closure member 250 is coupled to the actuator assembly 210 as noted above. As can be seen in FIGS. 7 and 8, the closure member 250 comprises a fixed portion 251 and a movable portion 252. The fixed portion 251 is sandwiched between the body 220 and the cover 240. This secures the closure member 250 in place, ensuring that it is retained and cannot become dislodged during operation. The movable portion 252 comprises a diaphragm 253 and a needle 254. The diaphragm 253 may comprise a center portion which is threaded to accept the needle 254. Optionally, the needle 254 may be attached to the diaphragm 253 via any known means.

FIG. 7 illustrates a cross-sectional view of the valve assembly 200 in the closed state. The closure member 250 is shown engaging the seat 290. Specifically, the needle 254 is configured to move along the longitudinal axis A-A of the valve assembly 200 in order to engage and disengage the seat 290. As the needle moves downward along the longitudinal axis A-A, it completely closes the flow path 223 and prevents fluid flow. In this condition, the valve is in the closed state. The needle 254 is moved when the actuator assembly 210 pushes against the movable portion 252 of the closure member 250. Because the needle 254 is attached to the movable portion 252, the needle 254 translates along the longitudinal axis A-A as the actuator assembly 210 pushes against the movable portion 252 of the closure member 250.

Turning to FIG. 8, a cross-sectional view of the valve assembly 200 in the open state is shown. The closure member 250 is shown retracted, with only a portion of the needle 254 in contact with the seat 290. Thus, even when in the open state, the needle 254 may still be in contact with the seat 290. Optionally, the valve assembly 200 may be configured such that the needle completely or nearly completely withdraws from the seat 290 when in the open state. As can be seen, the actuator assembly 210 is fully retracted, deflecting the diaphragm 253 of the movable portion 252 upward and allowing the needle 254 to nearly completely retract from the seat 290.

Figure 9:
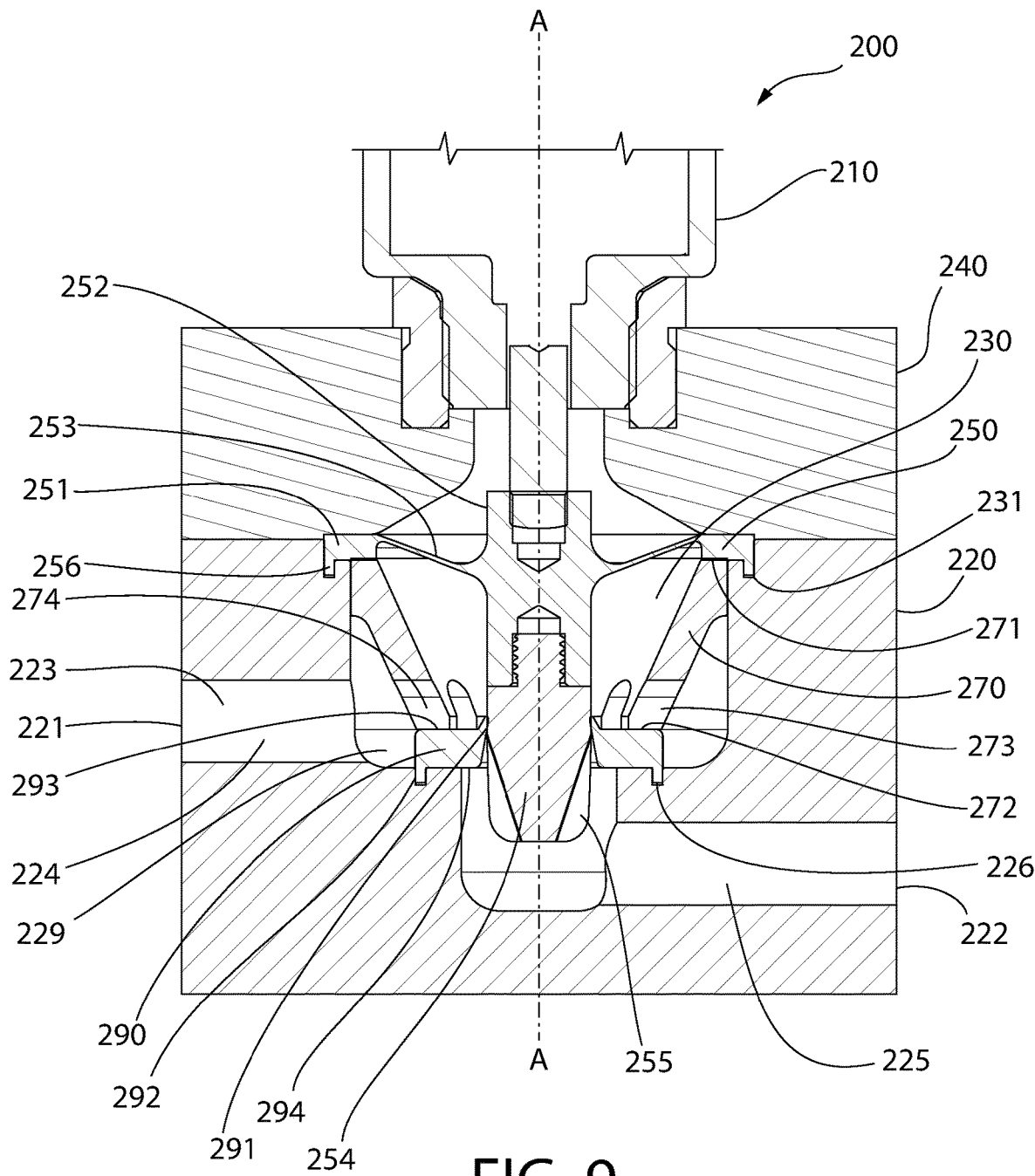
FIG. 9 is a cross-sectional view of a portion of the valve assembly of FIG. 6 when the valve assembly is in the closed state, taken along line VII-VII.
Figure 10:
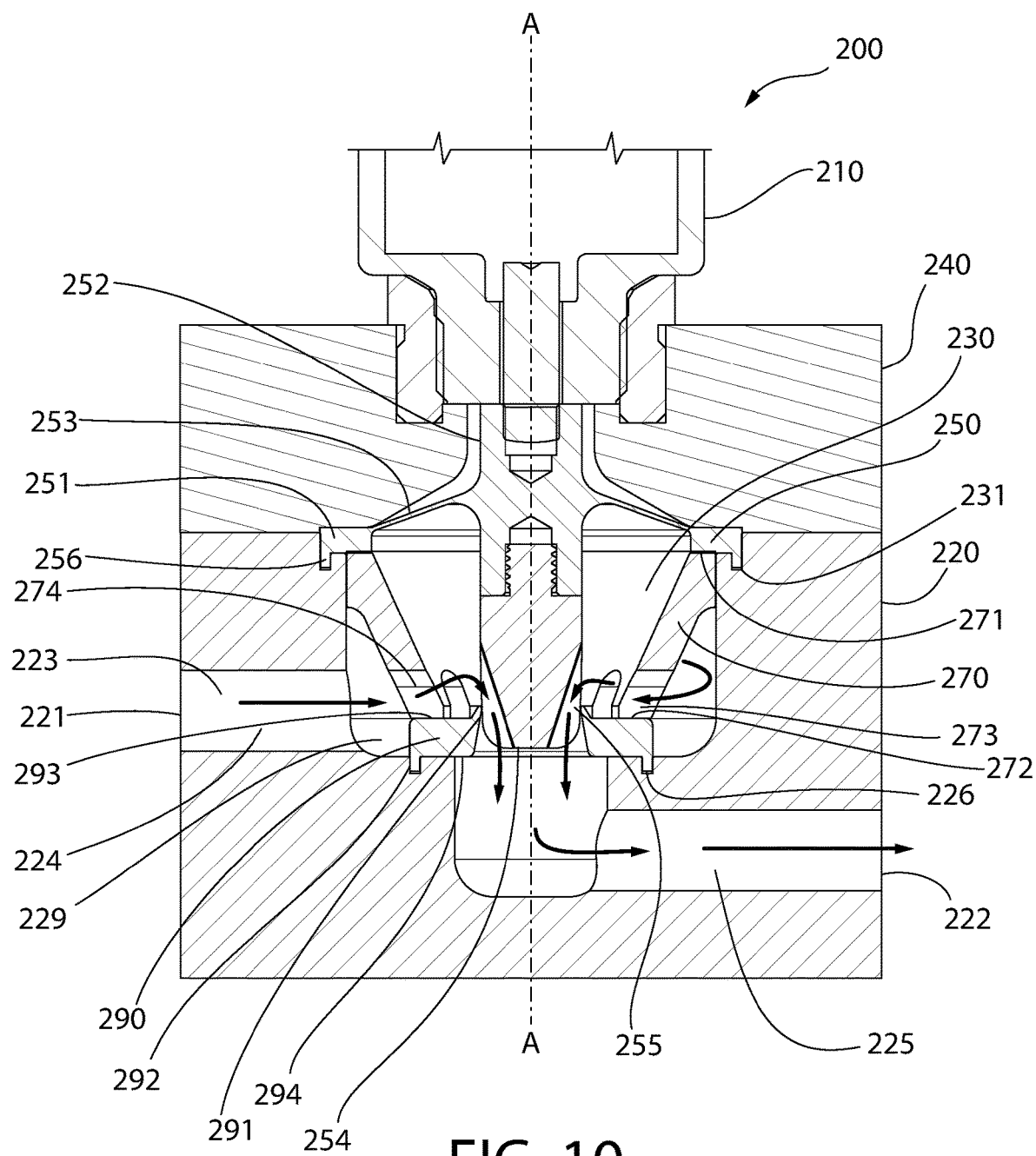
FIG. 10 is a cross-sectional view of the portion of the valve assembly of FIG. 6 when the valve assembly is in the open state, taken along line VII-VII.

FIG. 9 shows a closer view of a portion of the valve assembly 200, providing a close-up of the flow path 223, closure member 250, radial flow guide 270, and seat 290 when the valve assembly 200 is in the closed state. FIG. 10 shows the same view when the valve assembly 200 is in the open state. The needle 254 engages a lip 291 of the seat 290. The lip 291 is designed to be highly flexible so that it can effectively seal against the needle 254 and prevent fluid flow when the needle 254 is in the closed state. In the open state, some or all of the lip 291 is not in contact with the needle 254 to allow fluid flow through the valve assembly 200. The needle 254 has a plurality of grooves 255 which allow the passage of fluid past the seat 290 when the valve assembly 200 is in the open state.

The seat 290 further comprises an upper surface 293, a lower surface 294, and an annular ring 292. The body 220 comprises a pocket 227 having a floor 228. The pocket 227 forms a portion of the first volume 224 of the flow path 223, with the seat 290 resting against the floor 228 of the pocket 227. Specifically, the lower surface 294 of the seat 290 rests against the floor 228 of the pocket 227 of the body 220. The body 220 also comprises a lower annular groove 226 formed into the floor 228 of the pocket 227. The lower annular groove 226 has a generally rectangular cross section and is concentric with the longitudinal axis A-A. The lower annular groove 226 receives the annular ring 292 of the seat 290. The annular ring 292 engages the lower annular groove 226 to provide a seal between the body 220 and the seat 290 and aid in alignment during assembly. In other embodiments, the lower annular groove 226 may be semi-circular, trapezoidal, or any other profile used for sealing and retention of the seat 290 against the body 220.

The radial flow guide 270 has an upper surface 271 and a lower surface 272. The lower surface 272 of the radial flow guide 270 contacts the upper surface 293 of the seat 290. The radial flow guide 270 serves to hold the seat 290 in place. A plurality of castellations 273 are formed into the lower surface 272 of the radial flow guide 270. The plurality of castellations 273 and the upper surface 293 of the seat 290 collectively form a plurality of flow passages 274. The radial flow guide 270 divides the first volume 224 into an outer chamber 229 and an inner chamber 230. The outer chamber 229 is the portion of the first volume 224 between the inlet 221 and the radial flow guide 270. The inner chamber 230 is the portion of the first volume 224 between the radial flow guide 270 and the seat 290. As best seen in FIG. 10, fluid flows into the inlet 221, surrounds the radial flow guide 270, passes through the plurality of flow passages 274, then flows past the needle 254 and the seat 290 to the outlet 222.

The radial flow guide 270 is held in place by the fixed portion 251 of the closure member 250. In particular, the fixed portion 251 engages the upper surface 271 of the radial flow guide 270. The fixed portion 251 is secured to the body 220 by the cover 240, which may be bolted to the body 220 or otherwise secured so that the entire stack of closure member 250, radial flow guide 270, and seat 290 are compressed together and cannot shift or become dislodged. The fixed portion 251, the radial flow guide 270, and the seat 290 are compressed by the cover 240 such that they do not move, either along the longitudinal axis A-A or radially with respect to the longitudinal axis A-A. These components may be configured so that they deflect when the cover 240 is assembled to the body 220 to facilitate effective sealing of the closure member 250 against the body 220, ensuring a fluid-tight assembly.

The body 220 further comprises an upper annular groove 231. The upper annular groove 231 is concentric with the longitudinal axis A-A and surrounds the pocket 227. The upper annular groove 231 is rectangular in cross-section. The upper annular groove 231 receives an annular ring 256 of the closure member 250 to facilitate sealing of the closure member 250 against the body 220. In other embodiments, the upper annular groove 231 may be semi-circular, trapezoidal, or any other profile used for sealing and retention of the closure member 250 against the body 220.

Figure 11:
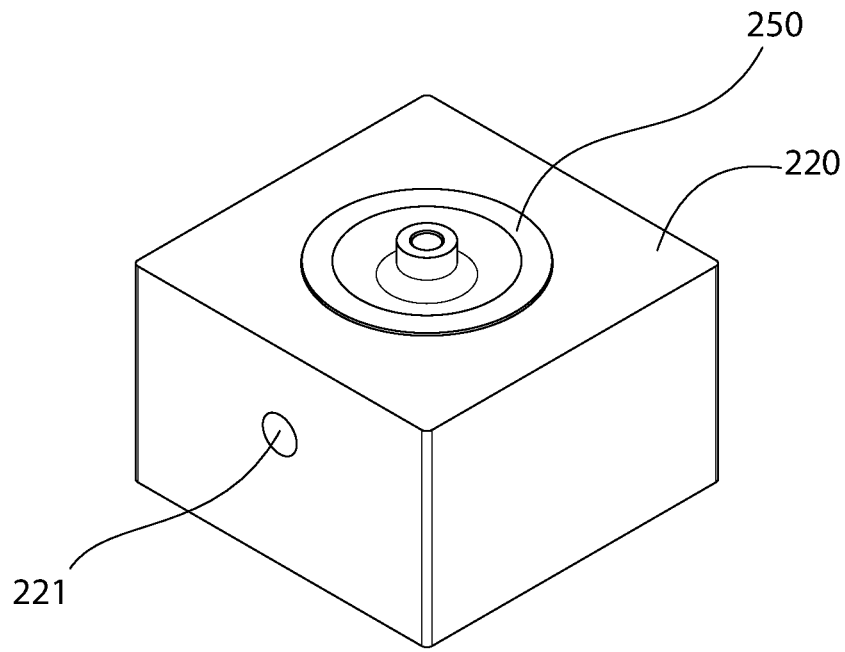
FIG. 11 is a perspective view illustrating a portion of the valve assembly of FIG. 6, a closure member of the valve assembly being in the closed state.
Figure 12:
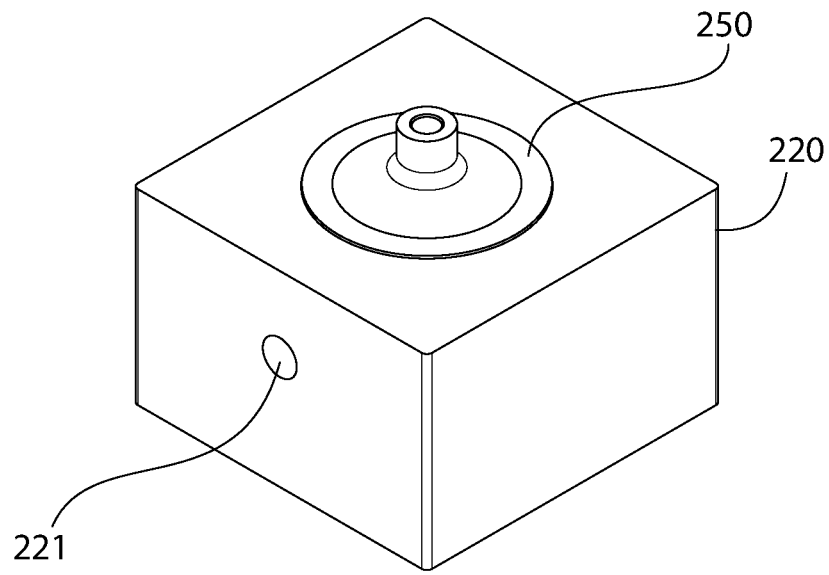
FIG. 12 is a perspective view illustrating the portion of the valve assembly FIG. 6, the closure member of the valve assembly being in the open state.
Figure 13:
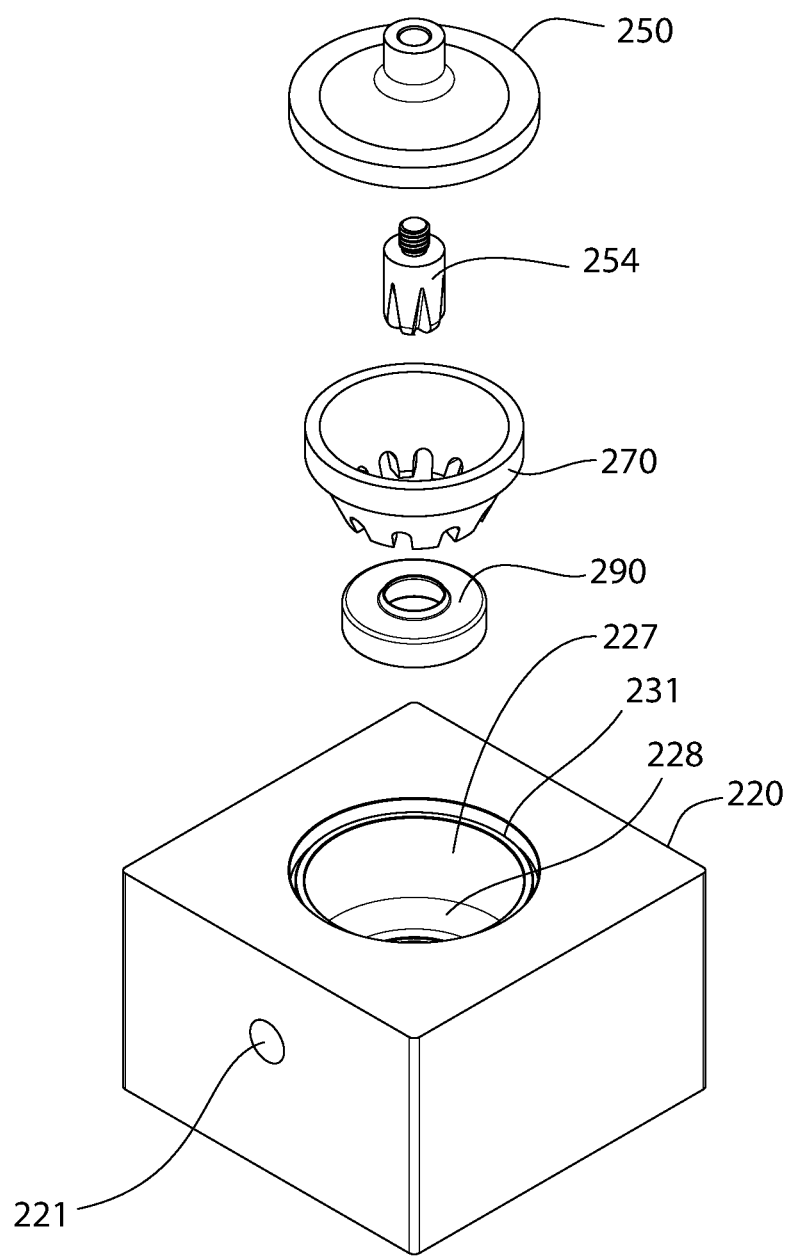
FIG. 13 is an exploded perspective view of the portion of the valve assembly of FIG. 11.
Figure 14:
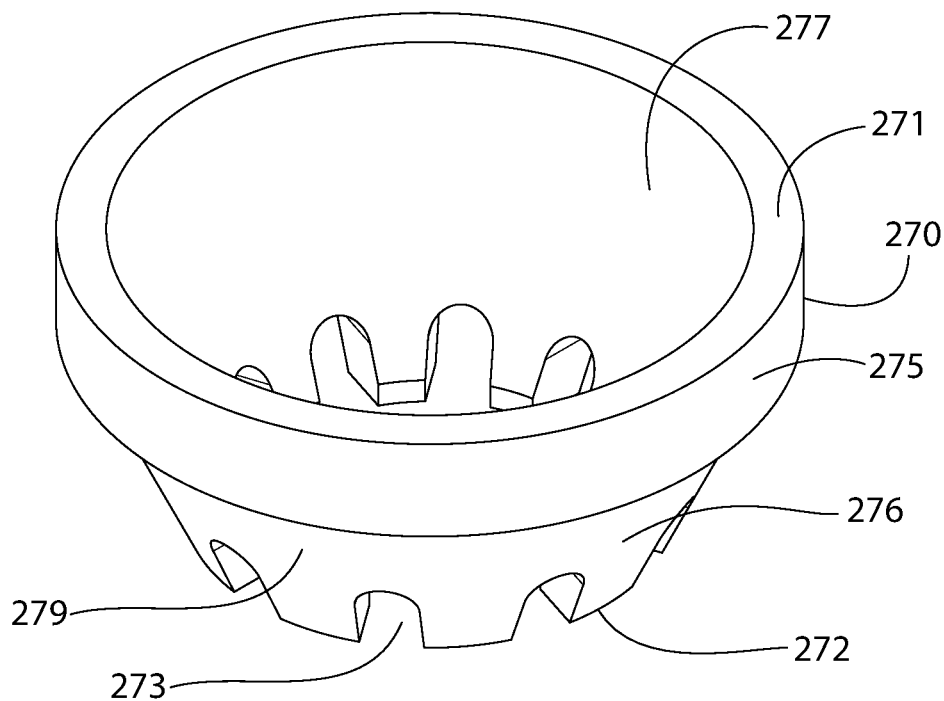
FIG. 14 is a perspective view of a radial flow guide of the valve assembly of FIG. 11.
Figure 15:
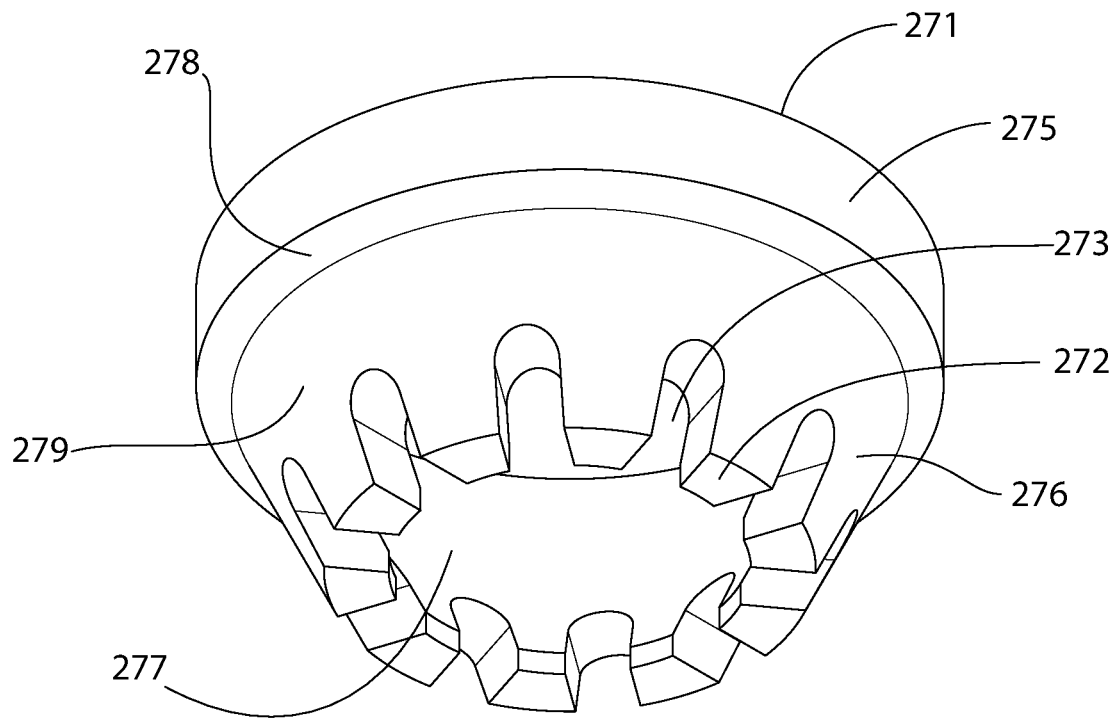
FIG. 15 is a bottom perspective view of the radial flow guide of the valve assembly of FIG. 11.
Figure 16:
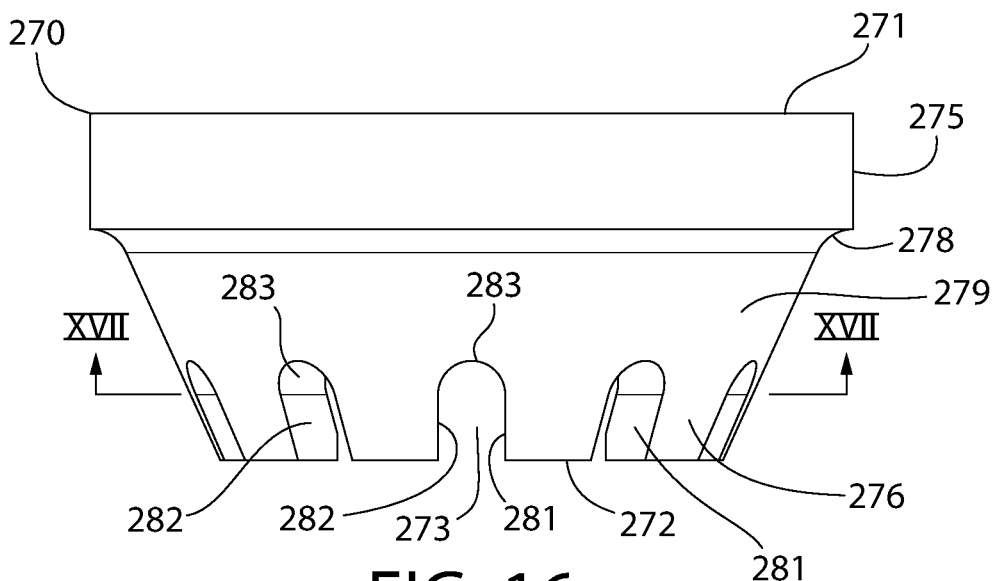
FIG. 16 is a front view of the radial flow guide of the valve assembly of FIG. 11.
Figure 17:
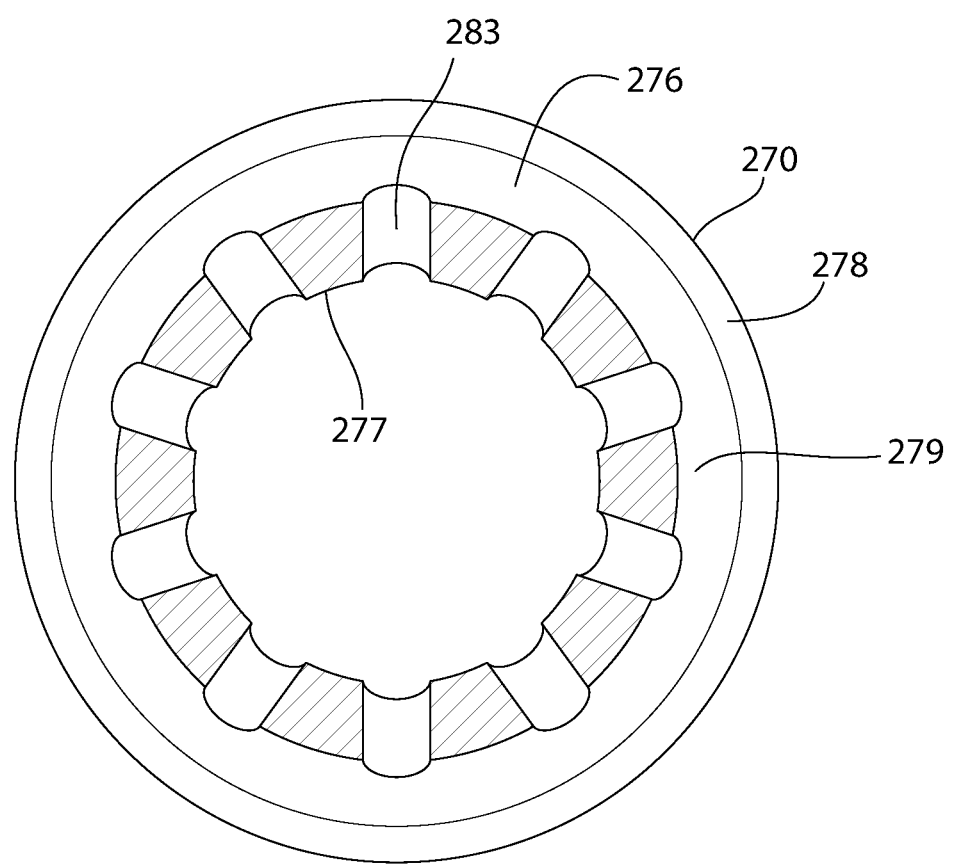
FIG. 17 is a cross-sectional view of the radial flow guide of the valve assembly of FIG. 16, taken along line XVII-XVII.
Figure 18:
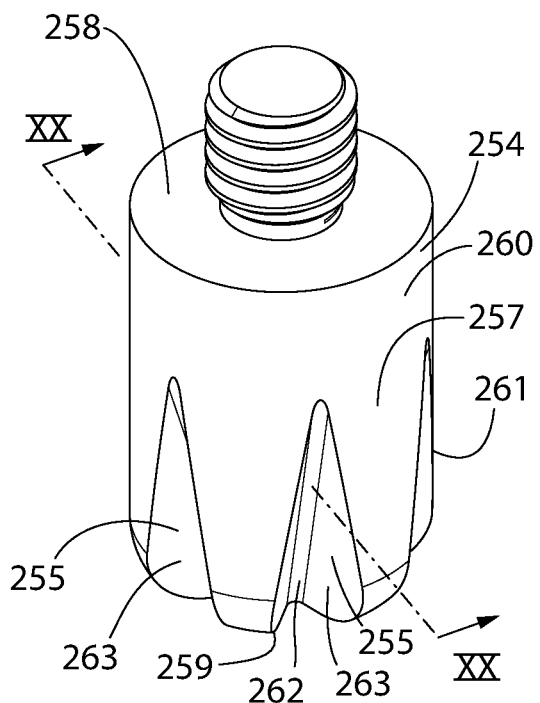
FIG. 18 is a perspective view of a needle of the valve assembly of FIG. 11.
Figure 19:
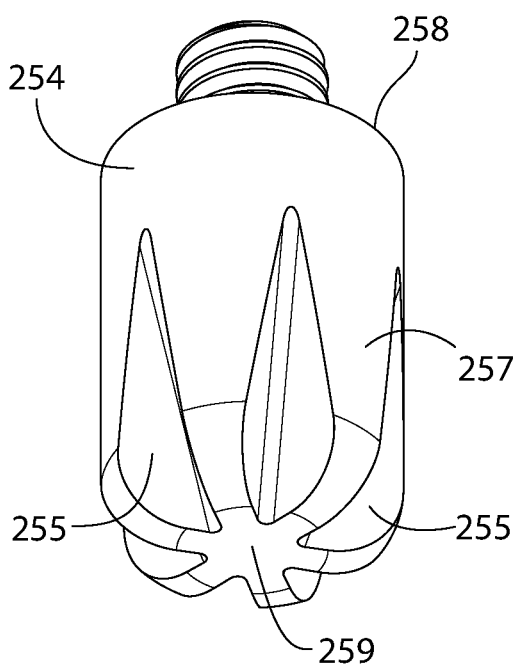
FIG. 19 is a bottom perspective view of the needle of FIG. 18.

Turning to FIGS. 11-13, views of the body 220 and associated components are shown. As can be seen, the seat 290 is assembled into the body 220 first. The radial flow guide 270 is assembled against the seat 290. Next, the closure member 250 is assembled such that the needle 254 and the movable portion 252 are secured together. Finally, the closure member 250 is assembled against the radial flow guide 270. The stack is then ready for assembly with the cover 240 and the actuator assembly 210.

FIGS. 14-17 show the radial flow guide 270 in greater detail. The radial flow guide extends from the upper surface 271 to the lower surface 272. The castellations 273 are formed into the lower surface 272. The radial flow guide 270 further comprises a cylindrical portion 275 adjacent the upper surface 271 and a conical portion 279 extending from the cylindrical portion 275 to the lower surface 272. The conical portion comprises a tapered outer surface 276 extending from the cylindrical portion 275 to the lower surface 272. The cylindrical portion 275 meets the tapered outer surface 276 at a flange 278, the flange 278 being perpendicular to the longitudinal axis A-A. In some embodiments, the flange 278 may be eliminated so that the tapered outer surface 276 meets the cylindrical portion 275 without any intervening surfaces. A tapered inner surface 277 extends from the upper surface 271 to the lower surface 272. The conical portion 279 has a constant wall thickness because the tapered outer surface 276 and the tapered inner surface 277 are parallel. However, in some embodiments the conical portion 279 may have a wall thickness that varies. As a result, the tapered outer surface 276 and the tapered inner surface 277 may not be parallel.

The castellations 273 are formed in the conical portion 279 and extend from the tapered outer surface 276 to the tapered inner surface 277. Thus, the castellations are formed into the lower surface 272, the tapered outer surface 276, and the tapered inner surface 277. The cylindrical portion 275 engages a wall of the pocket 227 of the body 220, providing radial alignment with respect to the longitudinal axis A-A. In the present embodiment, the radial flow guide 270 comprises ten castellations 273. However, in other embodiments the radial flow guide 270 may comprise a greater or lesser number of castellations 273. Furthermore, the radial flow guide 270 is rotationally symmetric, such that it can be positioned in the body 220 in any rotational orientation. In some embodiments, the radial flow guide 270 may incorporate a keying feature to engage a feature of the body 220, seat 290, or closure member 250 to provide a known rotational alignment. In the present embodiment, the tapered outer surface 276 and the tapered inner surface 277 are parallel, giving a constant wall thickness of the radial flow guide from the lower surface 272 to the flange 278.

The castellations 273 extend through the radial flow guide 270 in a generally radial direction, with parallel sides 281, 282 and an arcuate top 283. In some embodiments, the castellations 273 may have different shapes, such as circular, trapezoidal, triangular, or other shapes. In some embodiments, the castellations 273 may not extend to the lower surface 272. Thus, the castellations 273 may instead extend from the tapered outer surface 276 to the tapered inner surface 277 and form a closed profile. Thus, the flow passages 274 may be entirely formed in the radial flow guide 270. Furthermore, the castellations 273 may be arranged such that they do not extend radially with respect to the longitudinal axis A-A. Instead, they may extend in a direction that is non-intersecting with the longitudinal axis A-A or at an angle that intersects the longitudinal axis A-A at an angle other than 90 degrees. Finally, the castellations 273 need not have a constant cross-section, and may have variable cross-sectional profiles as they extend through the radial flow guide 270.

FIGS. 18-22 show the needle 254 of the closure member 250 in greater detail. As can be seen, the needle 254 comprises a plurality of grooves 255 arranged on an outer surface 257. The needle 254 extends from a top end 258 to a bottom end 259. As mentioned previously, the needle 254 translates along the longitudinal axis A-A when in use. The outer surface 257 of the needle 254 comprises a cylindrical portion 260 and a grooved portion 261. The cylindrical portion 260 extends from the top end 258 to the grooved portion 261, and the grooved portion 261 extends from the cylindrical portion 260 to the bottom end 259.

The cylindrical portion 260 has a cylindrical surface which is uninterrupted by grooves 255. The grooved portion 261 has a cylindrical surface which is broken by grooves 255. Whenever the grooved portion 261 is in contact with the lip 291 of the seat 290, fluid may pass through the grooves 255 and flow through the valve assembly 200. When the cylindrical portion 260 is in contact with the lip 291 of the seat 290, no fluid can pass through the valve assembly 200 and the valve assembly 200 is in the closed state. The cylindrical portion 260 has a first diameter and the grooved portion 261 has a second diameter, each of the first and second diameters being equal. This results in a smooth and continuous outer surface 257 which engages the lip 291 of the seat 290 except at the bottom end 259 of the needle 254 where the outer surface 257 transitions to the bottom end 259.

Furthermore, in the closed state, the needle 254 exclusively contacts the lip 291 of the seat 290 on the cylindrical portion 260. No flange or other tapered or perpendicular surface contacts the lip 291. The entirety of sealing is achieved by the lip 291 engaging the cylindrical portion 260. This reduces lip 291 wear, eliminates the possibility of deforming the lip 291 if the needle 254 is driven too far into the seat 290, and provides a larger range of motion of the movable portion 252 of the closure member 250 at which the valve assembly 200 is in the closed state.

As can be seen, the bottom end 259 of the needle 254 meets the outer surface 257 by way of a radius. The radius ensures that the needle 254 engages the lip 291 if the needle 254 becomes fully withdrawn from the seat 290. In alternate configurations, the needle 254 may have a taper or other shape which assists with alignment of the needle 254 and the seat 290. In the present embodiment, the bottom end 259 is planar. However, it is also conceived that the bottom end 259 may be pointed or concave.

Figure 20:
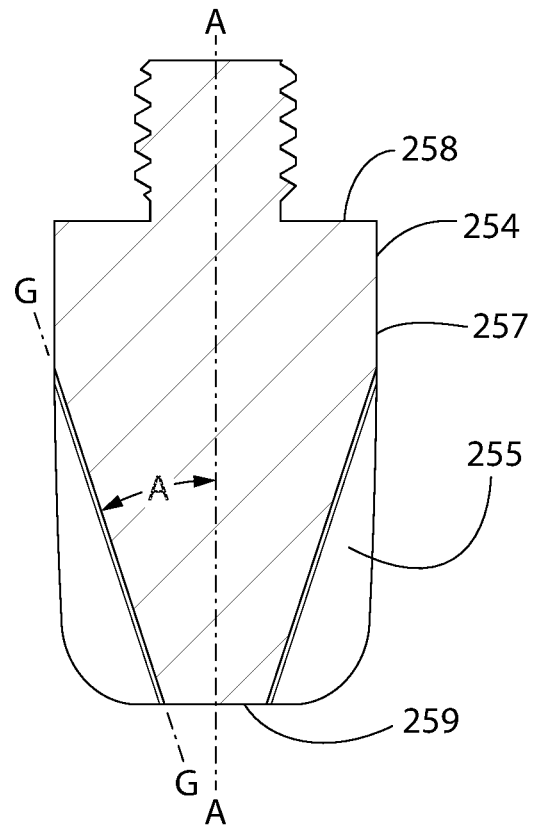
FIG. 20 is a cross-sectional view of the needle of FIG. 18, taken along line XX-XX.

As can be best seen in FIG. 20, each of the grooves 255 extends along a groove axis G-G which is at an acute angle A with respect to the longitudinal axis A-A. Each of the grooves 255 has a bottom surface 262 and a pair of side surfaces 263. In the present embodiment, the bottom surfaces 262 are arcuate, while the side surfaces 263 are planar. In other embodiments, the bottom surfaces 262 may be planar and the side surfaces 263 may be arcuate. The grooves 255 may have a variety of cross-sectional profiles, including different profiles on the same needle 254.

In the present embodiment, the bottom surfaces 262 of the grooves 255 have an increasing radial distance from the longitudinal axis with increasing distance from the bottom end 259. The angle A may vary, with different angles being used in different embodiments. It is also conceived that the same needle 254 may incorporate more than one groove angle. The grooves 255 may also terminate at different heights, as measured from the bottom end 259 to the top of the respective groove 255. In each case, the grooves 255 are constructed to yield an orifice area across the seat 290 that varies with increasing displacement of the needle 254 from the closed state to the open state. Thus, the groove angles A, the depth of the grooves 255, the shape of the grooves, and the end points of the grooves 255 may be varied in any configuration necessary to achieve the desired orifice area and resulting flow characteristics for a given application.

The present embodiment has six grooves 255. In other embodiments, the grooves 255 may be greater or fewer than six. In yet other embodiments, the number of grooves 255 may be equal to the number of castellations 273. In some embodiments, the number of grooves 255 may be greater than the number of castellations 273. It is also conceived that the grooves 255 may be rotationally aligned with the castellations 273. In yet other embodiments, the grooves 255 may be rotationally offset from the castellations 273. The grooves 255 may also be arranged such that the groove axis G-G that does not intersect the longitudinal axis A-A.

A method of utilizing the systems described above will now be discussed in greater detail. In a preferred embodiment, the aforementioned systems are used to implement a method of manufacturing articles such as semiconductor devices. In this method, an apparatus for controlling flow 100 is provided, the apparatus 100 comprising a valve assembly 200. The valve assembly 200 has a body 220 having an inlet 221 and an outlet 222. A flow path 223 extends between the inlet 221 and the outlet 222. A seat 290 is located in the flow path 223. A closure member 250 is configured to engage the seat 290 and obstruct the flow path 223 so that no fluid can flow through the valve assembly 200. An actuator assembly 210 is coupled to the closure member 250 to move the closure member 250 from a closed state which obstructs the flow path to an open state which permits fluid flow. A radial flow guide 270 is arranged in the flow path 223. Finally, a longitudinal axis A-A extends through the seat 290, the closure member 250, and the radial flow guide 270.

A process fluid is supplied to the apparatus 100 and flowed through the apparatus 100. Specifically, the process fluid flows through the valve assembly 200 of the apparatus 100. The process fluid is then delivered to an outlet manifold 401. The outlet manifold 401 fluidly couples the apparatus 100 to a processing chamber 1300. Process fluid then flows to the processing chamber 1300. The process fluid is used to perform a process on an article within the processing chamber. In some embodiments, the article being processed is a semiconductor device or is manufactured into a semiconductor device as a result of the processing performed in the method. Optionally, the radial flow guide 270 may be omitted. In yet other embodiments, the closure member 250 comprises a needle 254, the needle 254 comprising a plurality of grooves 255 allowing fluid to pass through the seat 290 when the closure member 250 is in an open state and preventing the flow of fluid when the closure member 250 is in a closed state.

Figure 23:
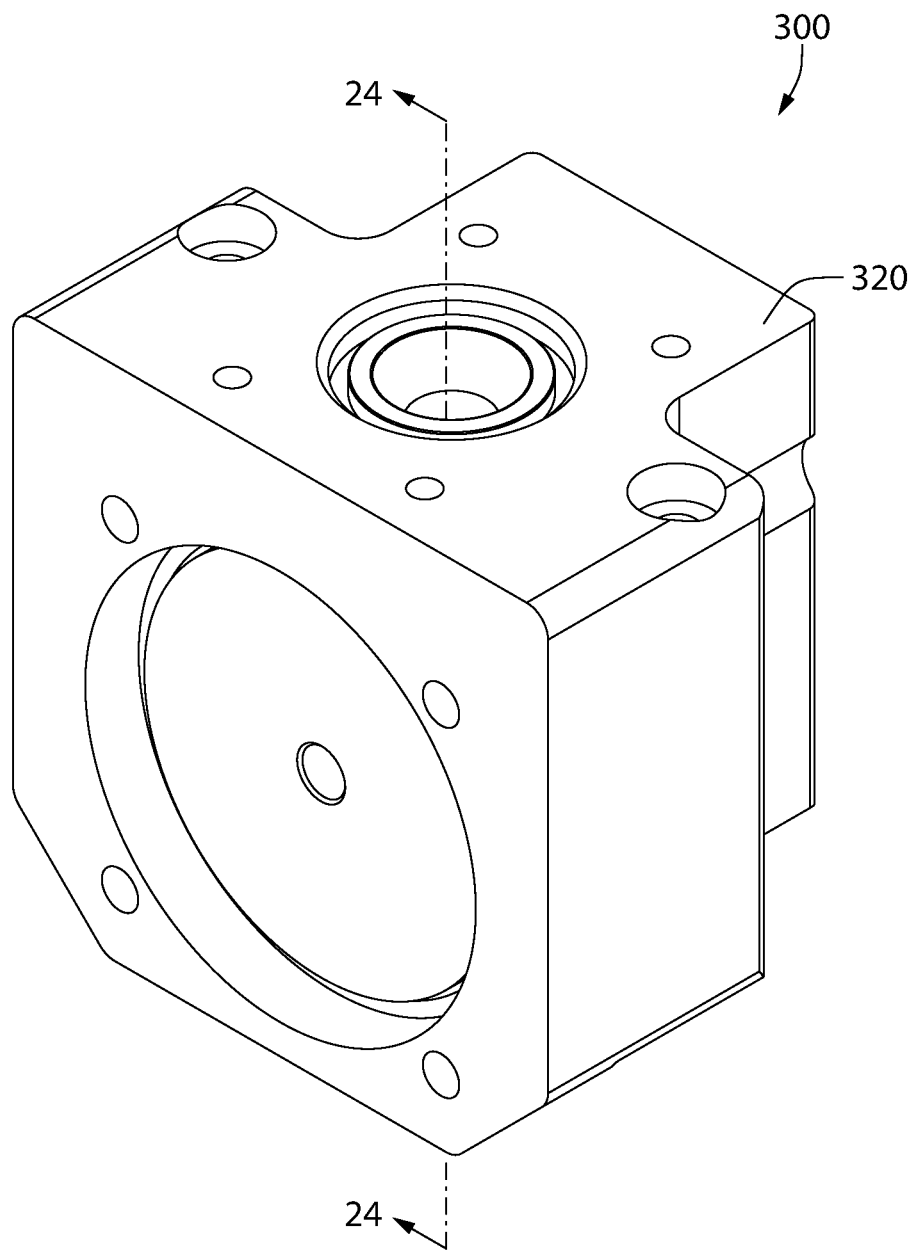
FIG. 23 is a perspective view illustrating a portion of another embodiment of a valve assembly.

Turning to FIGS. 23-32, another embodiment of a valve assembly 300 is shown with the actuator assembly omitted. FIG. 23 shows a perspective view of the valve assembly 300, the valve assembly 300 comprising a valve body 320 housing the components which define the fluid flow path and enable control of fluid flow. The valve assembly 300 may be an on/off valve, a proportional valve, or any other known type of valve and may be operated via an actuator assembly such as the actuator assembly 210 discussed above. The valve assembly 300 transitions from an open state to a closed state. Otherwise stated, the valve assembly 300 transitions from an open position to a closed position. Optionally, the valve assembly 300 may also be operated in any number of intermediate states between the open state and the closed state. For instance, the valve assembly 300 may be a proportional valve capable of providing a range of flow between the open state and the closed state. In the open state, fluid is free to flow through the valve assembly 300. In the closed state, fluid is blocked from flowing through the valve assembly 300. The valve assembly 300 may also permit flow at all intermediate states between the open state and the closed state. Optionally, the valve body 320 may be an integrally formed monolithic component. The valve assembly 300 may be one of a plurality of components that collectively form an apparatus for controlling flow 100.

Figure 24:
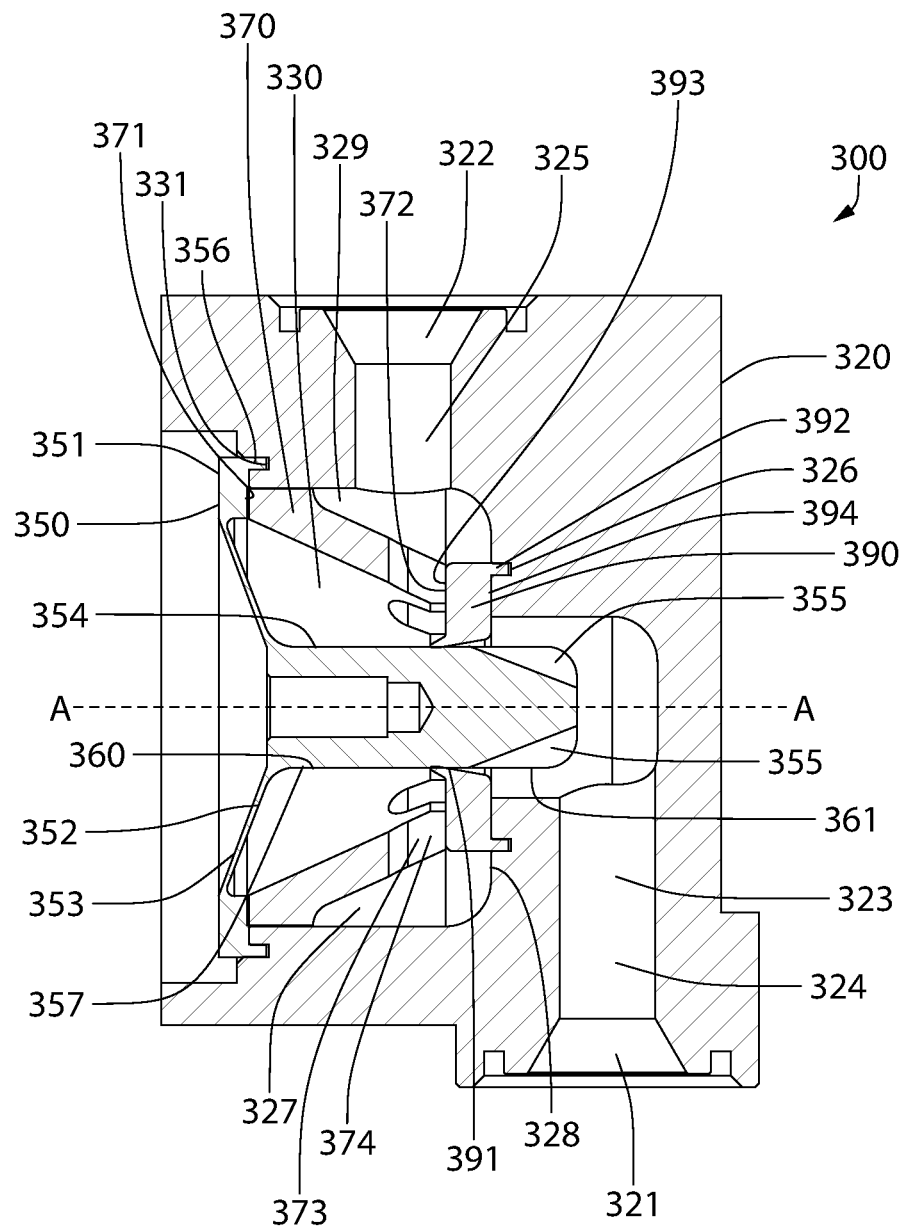
FIG. 24 is a cross-sectional view of the portion of the valve assembly of FIG. 23 in a fully closed state, taken along line 24-24.
Figure 25:
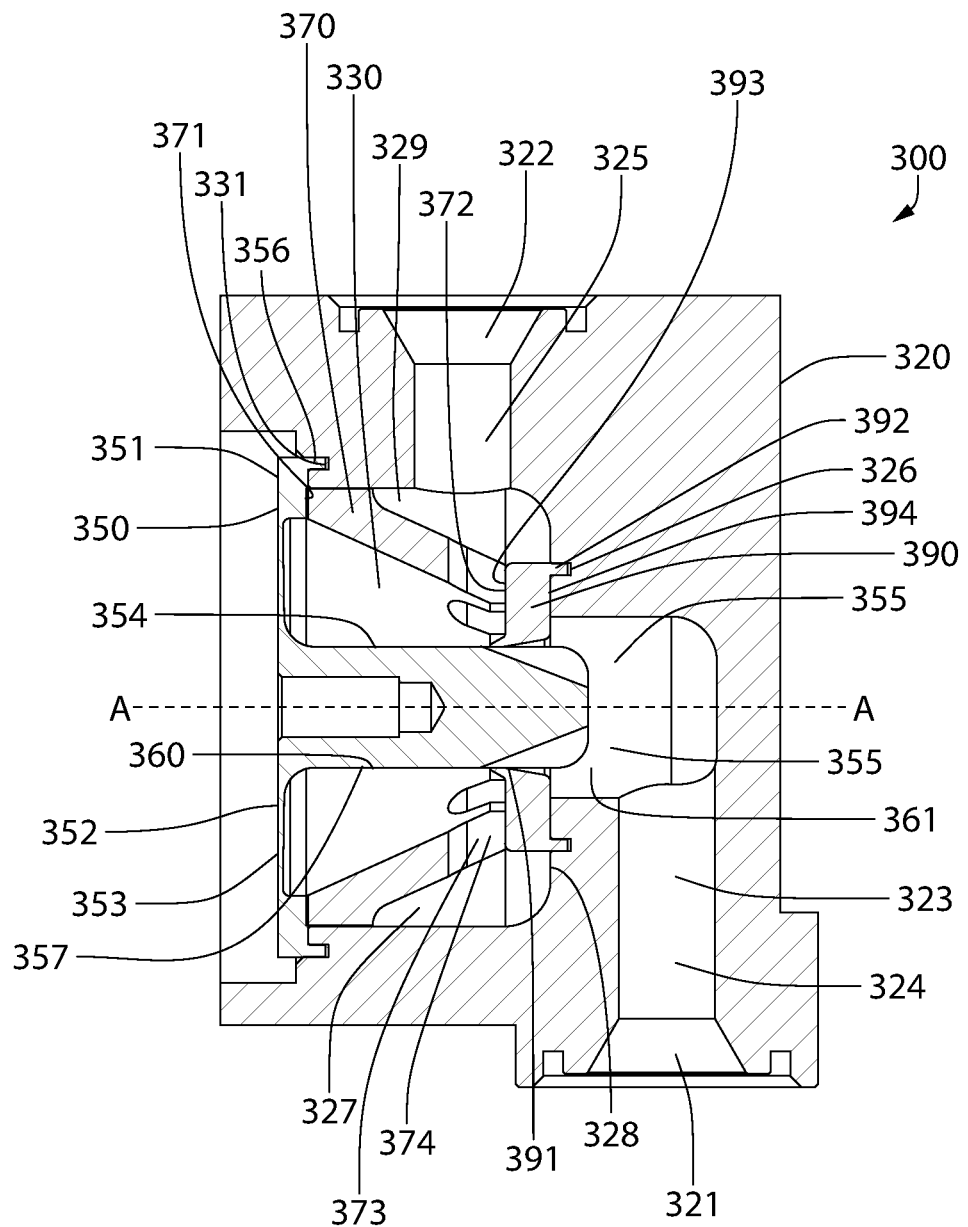
FIG. 25 is a cross-sectional view of the portion of the valve assembly of FIG. 23 in a partially open state, taken along line 24-24.
Figure 26:
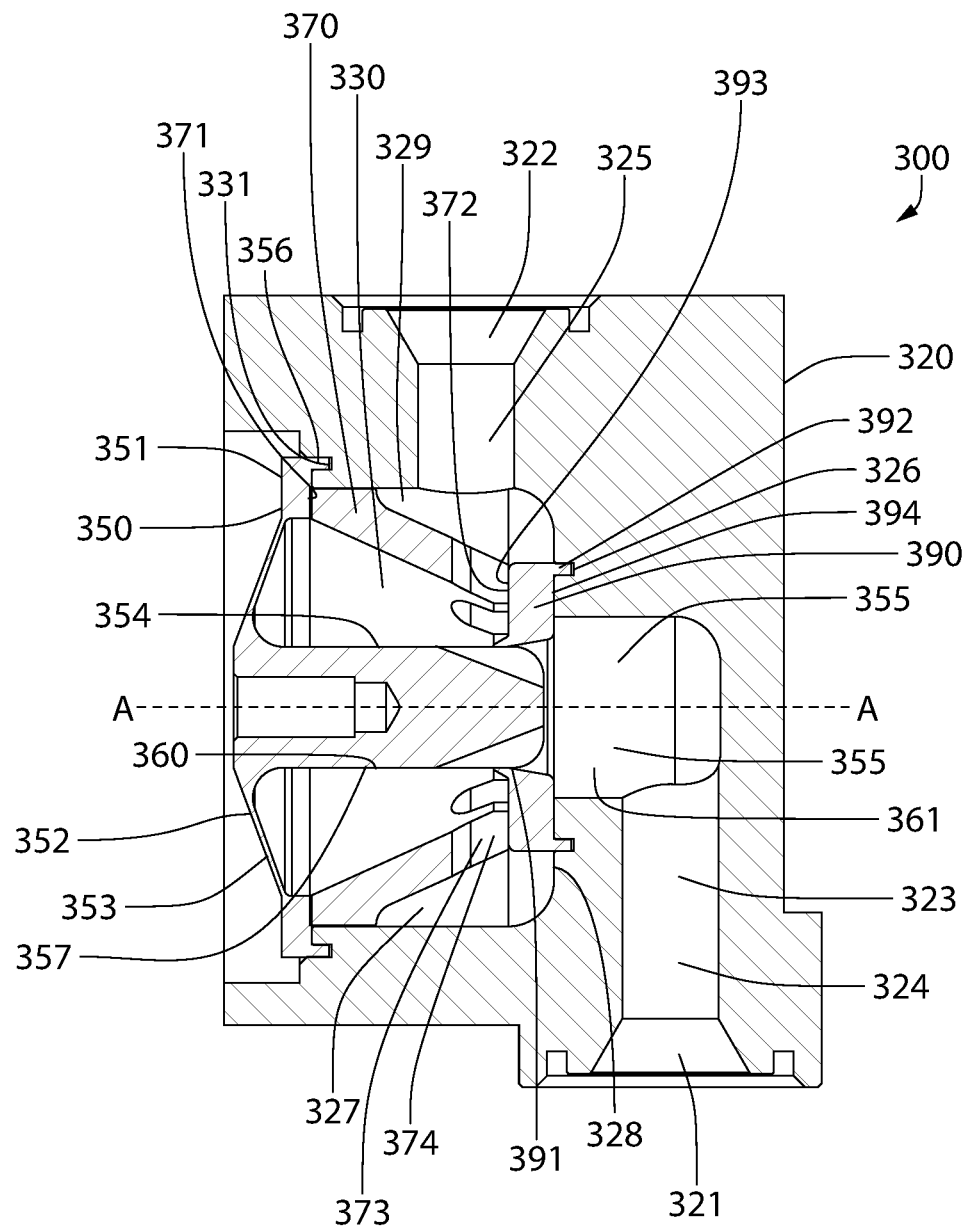
FIG. 26 is a cross-sectional view of the portion of the valve assembly of FIG. 23 in a fully open state, taken along line 24-24.

Turning to FIGS. 24 to 26, the internal components of the valve assembly 300 are shown in cross-sectional views illustrating three different states of the valve assembly 300. In FIG. 24, the valve assembly 300 is in the closed state. In FIG. 25, the valve assembly 300 is in a partially open state. In FIG. 26, the valve assembly 300 is in a fully open state. As can be understood, the partially open state is a state at which the valve assembly 300 permits flow but does not allow as much flow as when the valve assembly 300 is in the fully open state. There may be an infinite number of partially open states to allow control over the flow rate of fluid passing through the valve assembly 300 if so desired.

The valve assembly 300 further comprises a longitudinal axis A-A, a closure member 350, a radial flow guide 370, a seat 390, an inlet 321, and an outlet 322. The closure member 350 is configured to flex or otherwise move such that it can engage the seat 390 to control fluid flow through the valve body 320. Thus, fluid flows into the valve assembly 300 at the inlet 321, past the closure member 350 and the seat 390, and out of the outlet 322.

The body 320 of the valve assembly 300 comprises the inlet 321 and the outlet 322. The inlet 321 extends to the outlet 322 along a flow path 323. The flow path 323 comprises all internal volume of the body 320 of the valve assembly 300 not occupied by the closure member 350, the radial flow guide 370, or the seat 390. The flow path 323 is divided into a first volume 324 and a second volume 325. The first volume 324 comprises all internal volume of the flow path 323 from the inlet 321 to the seat 390, while the second volume 325 comprises all internal volume of the flow path 323 from the seat 390 to the outlet 322. Thus, the first volume 324 is upstream of the seat 390 while the second volume 325 is downstream of the seat 390. However, in some embodiments or implementations, the valve assembly 300 may flow fluid in both directions. The terminology above is used to reflect the most probable direction of fluid flow and aid in better understanding the workings of the valve assembly 300.

The closure member 350 is coupled to an actuator assembly as discussed in the first embodiment. As can be seen in FIGS. 24 to 26, the closure member 350 comprises a fixed portion 351 and a movable portion 352. The fixed portion 351 is sandwiched between the body 320 and a cover such as the cover 240 discussed above. This secures the closure member 350 in place, ensuring that it is retained and cannot become dislodged during operation. The movable portion 352 comprises a diaphragm 353 and a needle 354. In the present embodiment, the needle 354 is a monolithic, integrally formed, portion of the movable portion 352. In other embodiments, the diaphragm 353 may comprise a center portion which is threaded to accept the needle 354. Optionally, the needle 354 may be attached to the diaphragm 353 via any known means.

FIG. 24 illustrates a cross-sectional view of the valve assembly 300 in the closed state. The closure member 350 is shown engaging the seat 390. Specifically, the needle 354 is configured to move along the longitudinal axis A-A of the valve assembly 300 in order to engage and disengage the seat 390. As the needle 354 moves downward along the longitudinal axis A-A, it completely closes the flow path 323 and prevents fluid flow. In this condition, the valve assembly 300 is in the closed state. The needle 354 is moved when the actuator assembly pushes against the movable portion 352 of the closure member 350. Because the needle 354 is a part of the movable portion 352, the needle 354 translates along the longitudinal axis A-A.

The needle 354 engages a lip 391 of the seat 390. The lip 391 is designed to be highly flexible so that it can effectively seal against the needle 354 and prevent fluid flow when the needle 354 is in the closed state. In the open state, some or all of the lip 391 is not in contact with the needle 354 to allow fluid flow through the valve assembly 300. The needle 354 has a plurality of grooves 355 which allow the passage of fluid past the seat 390 when the valve assembly 300 is in the open state. The needle 354 further comprises an outer surface 357, the outer surface 357 comprising a cylindrical portion 360 and a grooved portion 361. The grooved portion 361 comprises the grooves 355.

The seat 390 further comprises an upper surface 393, a lower surface 394, and an annular ring 392. The body 320 comprises a pocket 327 having a floor 328. The pocket 327 forms a portion of the second volume 325 of the flow path 323, with the seat 390 resting against the floor 328 of the pocket 327. Specifically, the lower surface 394 of the seat 390 rests against the floor 328 of the pocket 327 of the body 320. The body 320 also comprises a lower annular groove 326 formed into the floor 328 of the pocket 327. The lower annular groove 326 has a generally rectangular cross section and is concentric with the longitudinal axis A-A. The lower annular groove 326 receives the annular ring 392 of the seat 390. The annular ring 392 engages the lower annular groove 326 to provide a seal between the body 320 and the seat 390 and aid in alignment during assembly. In other embodiments, the lower annular groove 326 may be semi-circular, trapezoidal, or any other profile used for sealing and retention of the seat 390 against the body 320.

The radial flow guide 370 has an upper surface 371 and a lower surface 372. The lower surface 372 of the radial flow guide 370 contacts the upper surface 393 of the seat 390. The radial flow guide 370 serves to hold the seat 390 in place. A plurality of castellations 373 are formed into the lower surface 372 of the radial flow guide 370. The plurality of castellations 373 and the upper surface 393 of the seat 390 collectively form a plurality of flow passages 374. The radial flow guide 370 divides the second volume 325 into an outer chamber 329 and an inner chamber 330. The outer chamber 329 is the portion of the second volume 325 between the inlet 321 and the radial flow guide 370. The inner chamber 330 is the portion of the first volume 324 between the radial flow guide 370 and the seat 390. When the valve assembly 300 is in the partially or fully open states, fluid flows into the inlet 321, surrounds the radial flow guide 370, passes through the plurality of flow passages 374, then flows past the needle 354 and the seat 390 to the outlet 322.

The radial flow guide 370 is held in place by the fixed portion 351 of the closure member 350. In particular, the fixed portion 351 engages the upper surface 371 of the radial flow guide 370. The fixed portion 351 is secured to the body 320 by the cover, which may be bolted to the body 320 or otherwise secured so that the entire stack of closure member 350, radial flow guide 370, and seat 390 are compressed together and cannot shift or become dislodged. The fixed portion 351, the radial flow guide 370, and the seat 390 are compressed by the cover such that they do not move, either along the longitudinal axis A-A or radially with respect to the longitudinal axis A-A. These components may be configured so that they deflect when the cover is assembled to the body 320 to facilitate effective sealing of the closure member 350 against the body 320, ensuring a fluid-tight assembly.

The body 320 further comprises an upper annular groove 331. The upper annular groove 331 is concentric with the longitudinal axis A-A and surrounds the pocket 327. The upper annular groove 331 is rectangular in cross-section. The upper annular groove 331 receives an annular ring 356 of the closure member 350 to facilitate sealing of the closure member 350 against the body 320. In other embodiments, the upper annular groove 331 may be semi-circular, trapezoidal, or any other profile used for sealing and retention of the closure member 350 against the body 320.

Turning to FIG. 25, a cross-sectional view of the valve assembly 300 in the partially open state is shown. The closure member 350 is shown retracted, with only a portion of the needle 354 in contact with the seat 390. Thus, even when in the partially open state, the needle 354 may still be partially in contact with the seat 390. As can be seen, the needle 354 is partially retracted because the diaphragm 353 of the movable portion 352 is deflected upward as compared with the position when the valve assembly 300 is in the closed position. The diaphragm 353 is approximately planar in the partially open state, allowing some fluid to pass through the grooves 355 of the needle 354. The lip 391 of the seat 390 is in contact with the grooved portion 361 of the needle 354 instead of the cylindrical portion 360, creating flow passages via the grooves 355 to allow fluid through the valve assembly 300.

Turning to FIG. 26, a cross-sectional view of the valve assembly 300 in the fully open state is shown. The closure member 350 is shown fully retracted, with only a portion of the needle 354 in contact with the seat 390. Thus, even when in the fully open state, the needle 354 may still be partially in contact with the seat 390. Optionally, the valve assembly 300 may be configured such that the needle completely or nearly completely withdraws from the seat 390 when in the open state. As can be seen, the needle 354 is retracted because the diaphragm 353 of the movable portion 352 is deflected upward as compared with the position when the valve assembly 300 is in the partially open or closed positions. The diaphragm 353 adopts a generally convex conical shape in the fully open state, allowing free flow of fluid through the grooves 355 of the needle 354. The lip 391 of the seat 390 is in contact with the grooved portion 361 of the needle 354, creating flow passages via the grooves 355 to allow fluid through the valve assembly 300. As can be seen, there is a greater area for fluid to flow as a result of a greater retraction of the needle 354 as compared with the partially open state.

Figure 27:
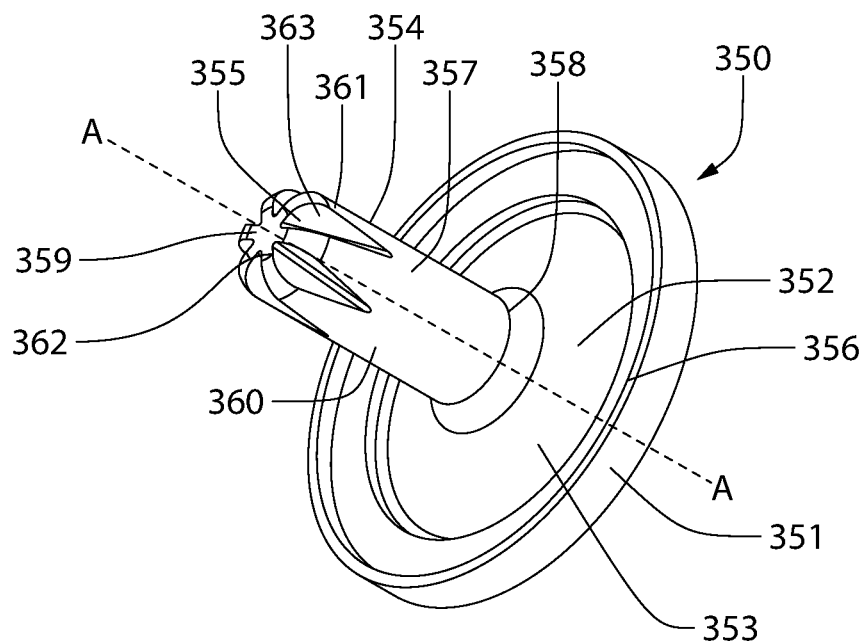
FIG. 27 is a perspective view of a closure member of the valve assembly of FIG. 23.
Figure 28:
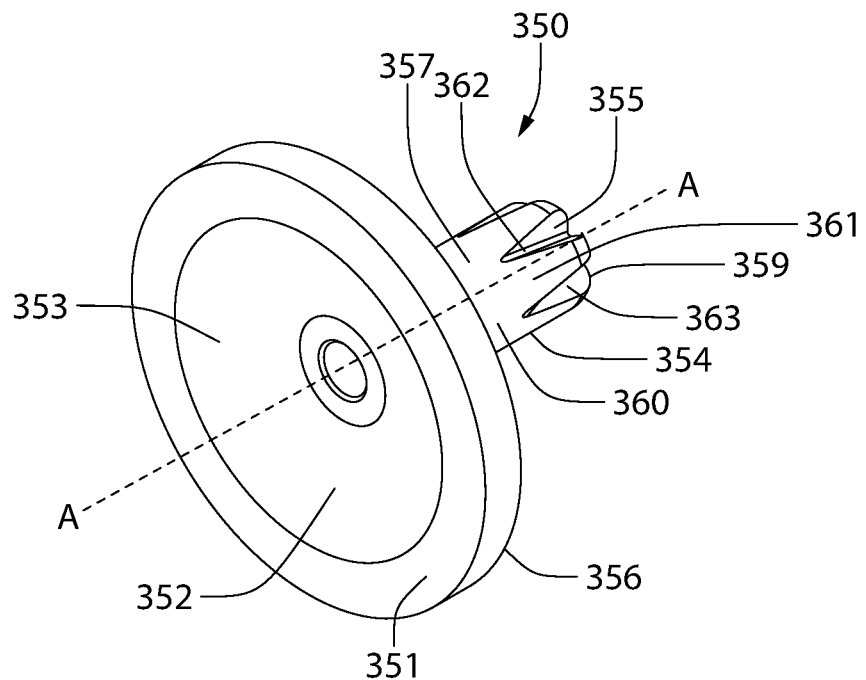
FIG. 28 is a bottom perspective view of the closure member of FIG. 27.

FIGS. 27 and 28 show the closure member 350 in greater detail. The closure member 350 is constructed with the fixed portion 351 circumferentially surrounding the movable portion 352. The movable portion 352 includes the diaphragm 353 and the needle 354. The diaphragm 353 is a thin disc of material which is joined to the fixed portion 351 at the outside and the needle 354 at the inside. Thus, the diaphragm 353 can deflect, allowing movement of the needle 354 in a longitudinal direction. The needle 354 can then move axially along the longitudinal axis A-A as illustrated previously, allowing the valve assembly 300 to transition from the closed state to the fully open state and all positions between the closed state and the fully open state. The fixed portion 351 further incorporates the annular ring 356, the annular ring 356 providing both alignment and sealing functions when engaging the upper annular groove 331 of the body 320.

The needle 354 further incorporates an outer surface 357, the outer surface 357 having the cylindrical portion 360 and the grooved portion 361. The cylindrical portion 360 is adjacent the diaphragm 353 while the grooved portion 361 is separated from the diaphragm 353 by the cylindrical portion 360. The needle 354 extends from a top end 358 to a bottom end 359. The top end 358 is adjacent the diaphragm 353. Thus, the cylindrical portion 360 is adjacent the top end 358 while the grooved portion 361 is adjacent the bottom end 359.

The cylindrical portion 360 has a cylindrical surface which is uninterrupted by grooves 355. The grooved portion 361 has a cylindrical surface which is broken by grooves 355. Whenever the grooved portion 361 is in contact with the lip 391 of the seat 390, fluid may pass through the grooves 355 and flow through the valve assembly 300. When the cylindrical portion 360 is in contact with the lip 391 of the seat 390, no fluid can pass through the valve assembly 300 and the valve assembly 300 is in the closed state. The cylindrical portion 360 has a first diameter and the grooved portion 361 has a second diameter, each of the first and second diameters being equal. This results in a smooth and continuous outer surface 357 which engages the lip 391 of the seat 390 except at the bottom end 359 of the needle 354 where the outer surface 357 transitions to the bottom end 359.

Furthermore, in the closed state, the needle 354 exclusively contacts the lip 391 of the seat 390 on the cylindrical portion 360. No flange or other tapered or perpendicular surface contacts the lip 391. The entirety of sealing is achieved by the lip 391 engaging the cylindrical portion 360. This reduces lip 391 wear, eliminates the possibility of deforming the lip 391 if the needle 354 is driven too far into the seat 390, and provides a larger range of motion of the movable portion 352 of the closure member 350 at which the valve assembly 200 is in the closed state.

As can be seen, the bottom end 359 of the needle 354 meets the outer surface 357 by way of a radius. The radius ensures that the needle 354 engages the lip 391 if the needle 354 becomes fully withdrawn from the seat 390. In alternate configurations, the needle 354 may have a taper or other shape which assists with alignment of the needle 354 and the seat 390. In the present embodiment, the bottom end 359 is planar. However, it is also conceived that the bottom end 359 may be pointed or concave.

As with the needle 254, each of the grooves 355 extends along a groove axis which is at an acute angle with respect to the longitudinal axis A-A. Each of the grooves 355 has a bottom surface 362 and a pair of side surfaces 363. In the present embodiment, the bottom surfaces 362 are arcuate, while the side surfaces 363 are planar. In other embodiments, the bottom surfaces 362 may be planar and the side surfaces 363 may be arcuate. Alternately, the bottom surfaces 362 may form a plurality of lines having a negligible curvature and the side surfaces 363 may be planar. The grooves 355 may have a variety of cross-sectional profiles, including different profiles on the same needle 354. In addition, the grooves 355 need not have a straight progression through the needle 354. Instead, the grooves 355 may be curved or angled about the longitudinal axis A-A such that they produce a swirling action in the flow of the fluid. Yet other configurations are contemplated.

In the present embodiment, the bottom surfaces 362 of the grooves 355 have an increasing radial distance from the longitudinal axis with increasing distance from the bottom end 359. The angle may vary, with different angles being used in different embodiments or even different angles in different grooves 355 on the same needle 354. The grooves 355 may also terminate at different heights, as measured from the bottom end 359 to the top of the respective groove 355. In each case, the grooves 355 are constructed to yield an orifice area across the seat 390 that varies with increasing displacement of the needle 354 from the closed state to the open state. Thus, the groove angles, the depth of the grooves 355, the shape of the grooves, and the end points of the grooves 355 may be varied in any configuration necessary to achieve the desired orifice area and resulting flow characteristics for a given application.

Figure 29:
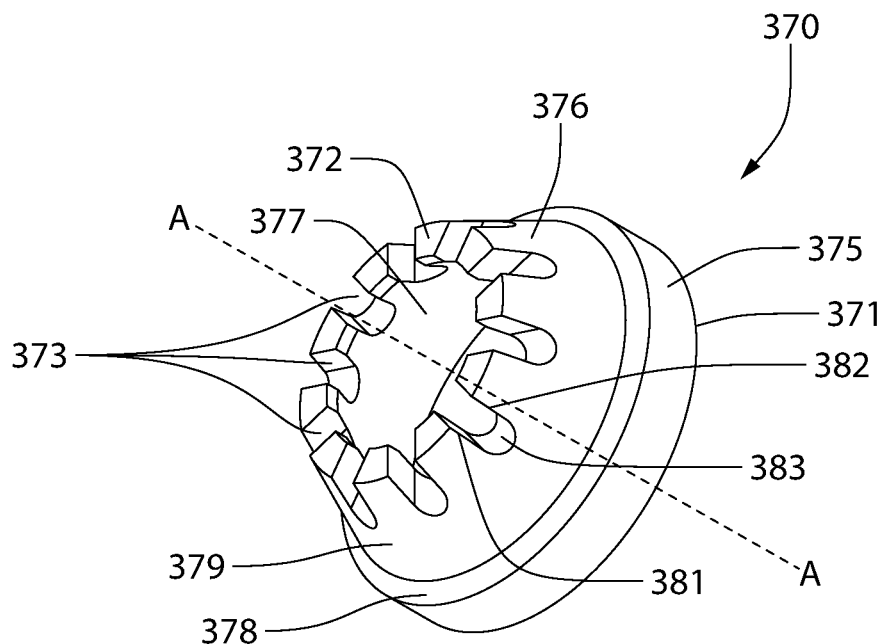
FIG. 29 is a perspective view of a radial flow guide of the valve assembly of FIG. 23.
Figure 30:
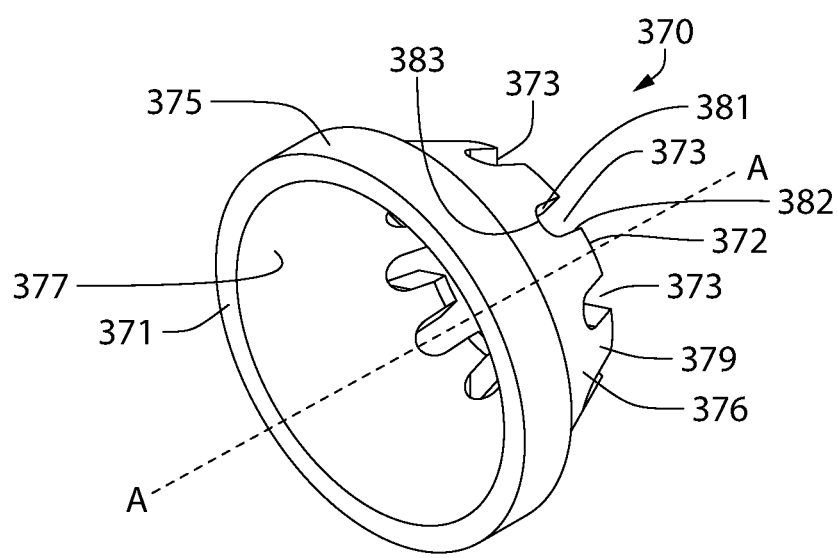
FIG. 30 is a bottom perspective view of the radial flow guide of FIG. 29.

FIGS. 29 and 30 show the radial flow guide 370. The radial flow guide 370 extends from the upper surface 371 to the lower surface 372. The castellations 373 are formed into the lower surface 372. The radial flow guide 370 further comprises a cylindrical portion 375 adjacent the upper surface 371 and a conical portion 379 extending from the cylindrical portion 375 to the lower surface 372. The conical portion 379 comprises a tapered outer surface 376 extending from the cylindrical portion 375 to the lower surface 372. The cylindrical portion 375 meets the tapered outer surface 376 at a flange 378, the flange 378 being perpendicular to the longitudinal axis A-A. In some embodiments, the flange 378 may be eliminated so that the tapered outer surface 376 meets the cylindrical portion 375 without any intervening surfaces. A tapered inner surface 377 extends from the upper surface 371 to the lower surface 372. The conical portion 379 has a constant wall thickness because the tapered outer surface 376 and the tapered inner surface 377 are parallel. However, in some embodiments the conical portion 379 may have a wall thickness that varies. As a result, the tapered outer surface 376 and the tapered inner surface 377 may not be parallel.

The castellations 373 are formed in the conical portion 379 and extend from the tapered outer surface 376 to the tapered inner surface 377. Thus, the castellations 373 are formed into the lower surface 372, the tapered outer surface 376, and the tapered inner surface 377. The cylindrical portion 375 engages a wall of the pocket 327 of the body 320, providing radial alignment with respect to the longitudinal axis A-A. In the present embodiment, the radial flow guide 370 comprises ten castellations 373. However, in other embodiments the radial flow guide 370 may comprise a greater or lesser number of castellations 373. Furthermore, the radial flow guide 370 is rotationally symmetric, such that it can be positioned in the body 320 in any rotational orientation. In some embodiments, the radial flow guide 370 may incorporate a keying feature to engage a feature of the body 320, seat 390, or closure member 350 to provide a known rotational alignment. In the present embodiment, the tapered outer surface 376 and the tapered inner surface 377 are parallel, giving a constant wall thickness of the radial flow guide from the lower surface 372 to the flange 378.

The castellations 373 extend through the radial flow guide 370 in a generally radial direction, with parallel sides 381, 382 and an arcuate top 383. In some embodiments, the castellations 373 may have different shapes, such as circular, trapezoidal, triangular, or other shapes. In some embodiments, the castellations 373 may not extend to the lower surface 372. Thus, the castellations 373 may instead extend from the tapered outer surface 376 to the tapered inner surface 377 and form a closed profile. Thus, the flow passages 374 may be entirely formed in the radial flow guide 370. Furthermore, the castellations 373 may be arranged such that they do not extend radially with respect to the longitudinal axis A-A. Instead, they may extend in a direction that is non-intersecting with the longitudinal axis A-A or at an angle that intersects the longitudinal axis A-A at an angle other than 90 degrees. Finally, the castellations 373 need not have a constant cross-section, and may have variable cross-sectional profiles as they extend through the radial flow guide 370.

Figure 31:
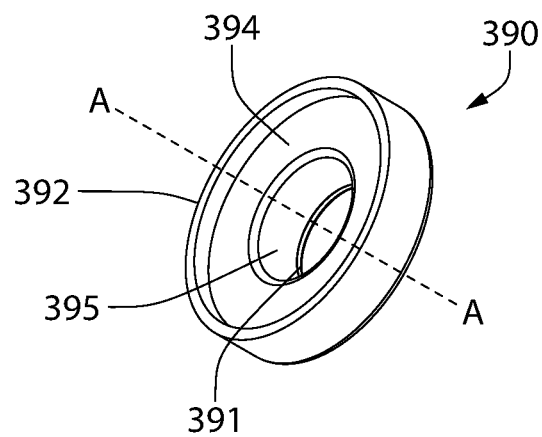
FIG. 31 is a perspective view of a seat of the valve assembly of FIG. 23.
Figure 32:
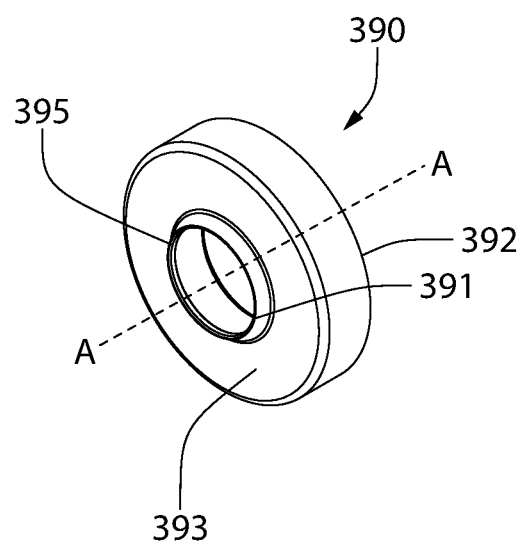
FIG. 32 is a bottom perspective view of the seat of FIG. 31.

FIGS. 31 and 32 illustrate the seat 390. The seat 390 extends from the upper surface 393 to the lower surface 394. The annular ring 392 extends from the lower surface 394 and is generally concentric about the longitudinal axis A-A. The seat 390 further includes a lip 391 extending from the upper surface 393 and defining a central aperture 395. The lip 391 may take the form of a lip seal or may instead be formed as any other type of seal. For instance, the lip 391 may be a labyrinth seal instead of a lip seal. Any type of seal suitable for engaging the needle 394 may be utilized in the seat 390 to facilitate sealing of the valve assembly 300 as desired.

Figure 33:
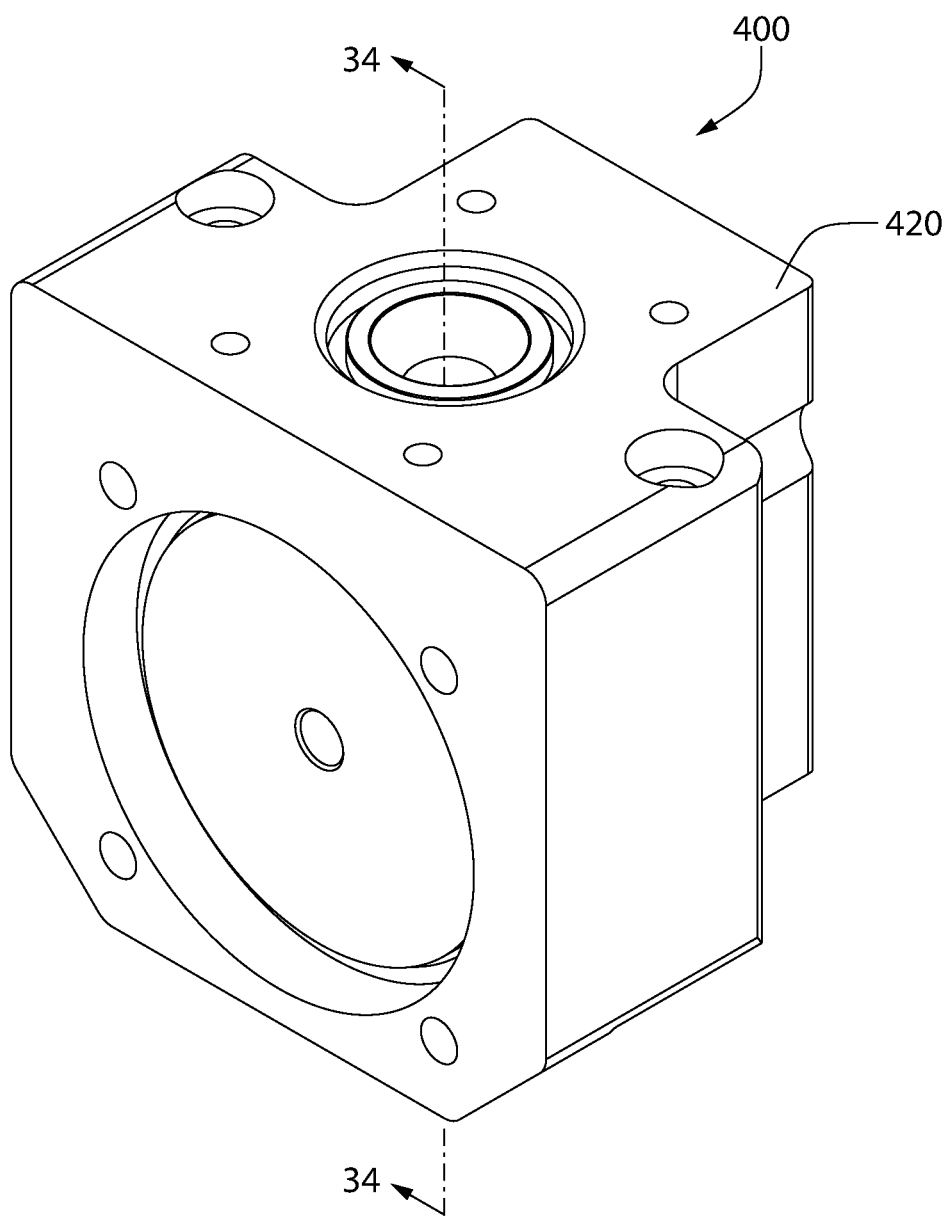
FIG. 33 is a perspective view illustrating a portion of another embodiment of a valve assembly.

Turning to FIGS. 33-40, another embodiment of a valve assembly 400 is shown with the actuator assembly omitted. FIG. 33 shows a perspective view of the valve assembly 400, the valve assembly 400 comprising a valve body 420 housing the components which define the fluid flow path and enable control of fluid flow. The valve assembly 400 may be an on/off valve, a proportional valve, or any other known type of valve and may be operated via an actuator assembly such as the actuator assembly 210 discussed above. The valve assembly 400 transitions from an open state to a closed state. Otherwise stated, the valve assembly 400 transitions from an open position to a closed position. Optionally, the valve assembly 400 may also be operated in any number of intermediate states between the open state and the closed state. For instance, the valve assembly 400 may be a proportional valve capable of providing a range of flow between the open state and the closed state. In the open state, fluid is free to flow through the valve assembly 400. In the closed state, fluid is blocked from flowing through the valve assembly 400. The valve assembly 400 may also permit flow at all intermediate states between the open state and the closed state. Optionally, the valve body 420 may be an integrally formed monolithic component. The valve assembly 400 may be one of a plurality of components that collectively form an apparatus for controlling flow 100.

Figure 34:
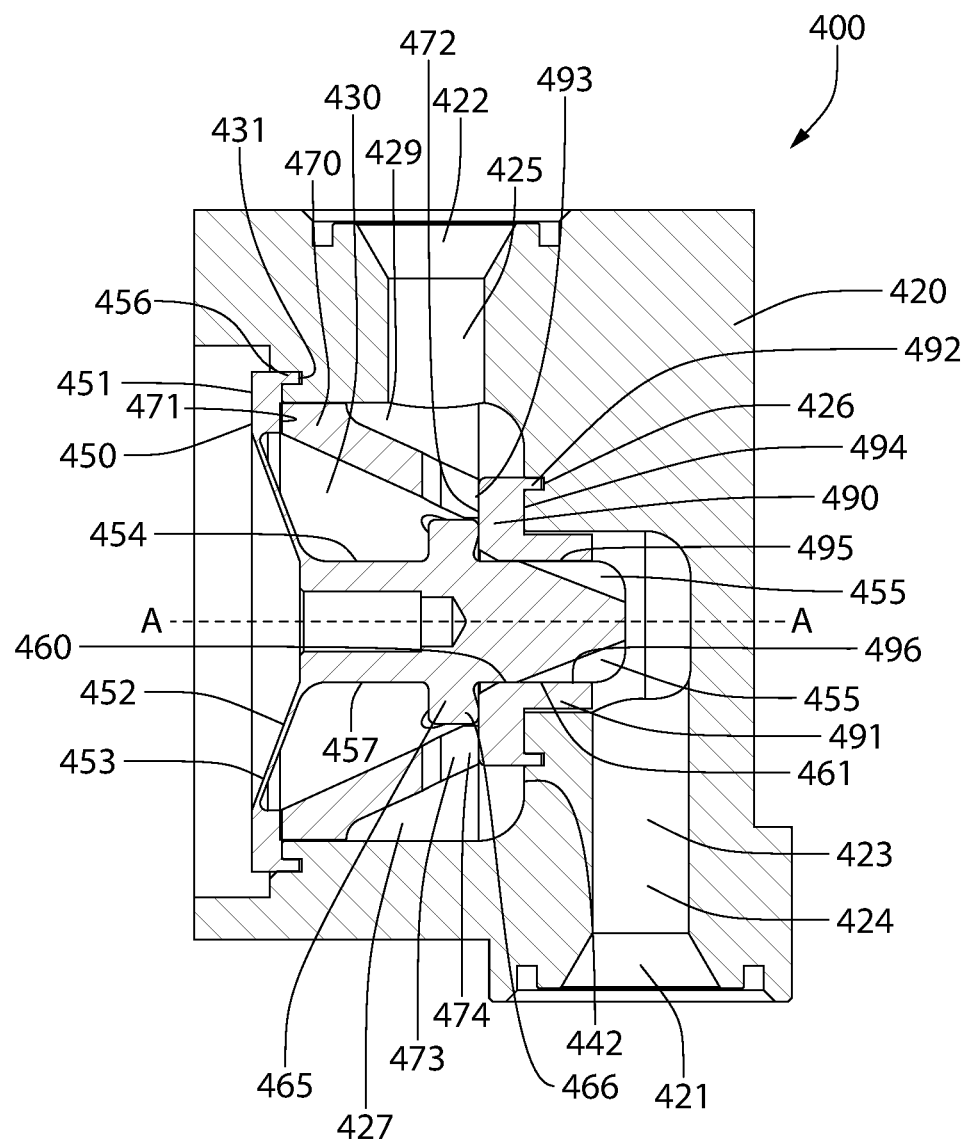
FIG. 34 is a cross-sectional view of the portion of the valve assembly of FIG. 33 in a fully closed state, taken along line 34-34.
Figure 35:
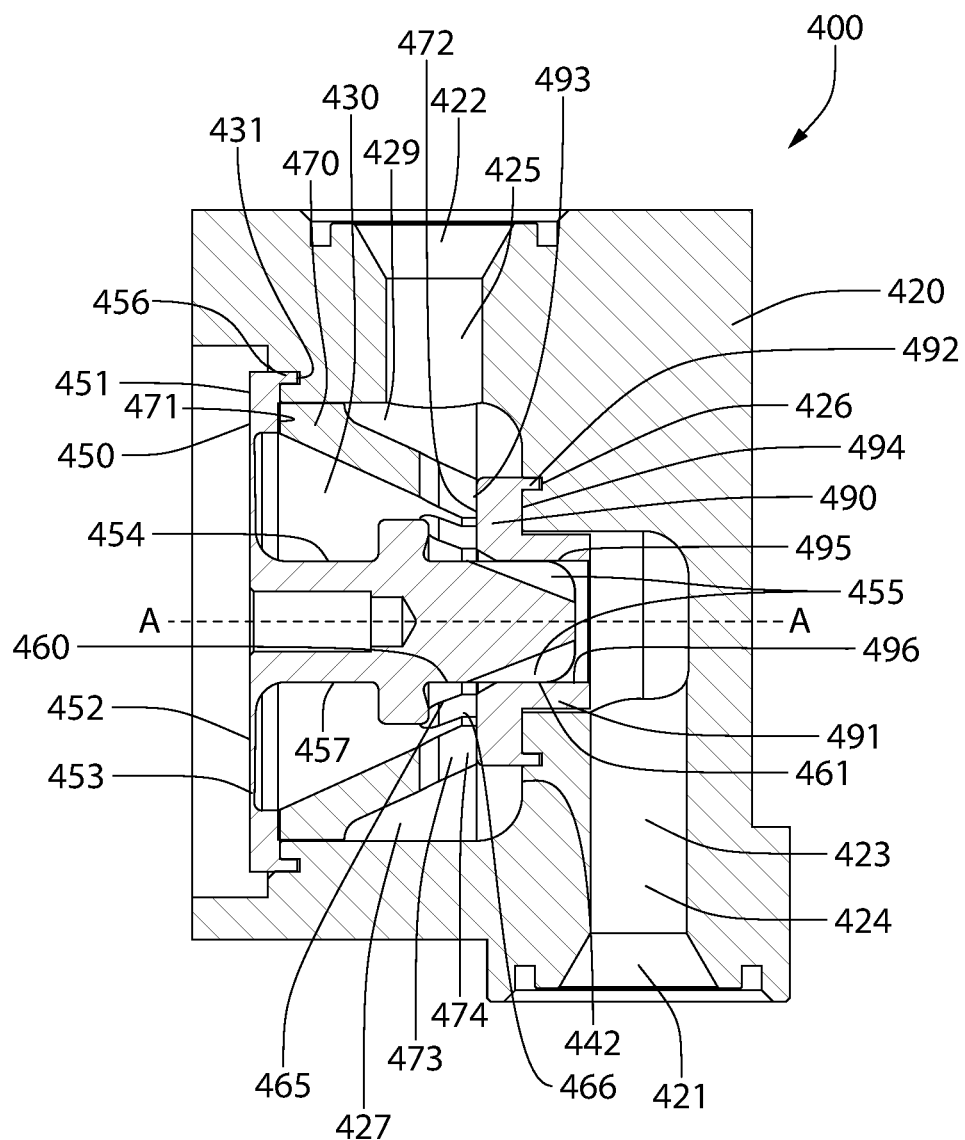
FIG. 35 is a cross-sectional view of the portion of the valve assembly of FIG. 33 in a partially open state, taken along line 34-34.
Figure 36:
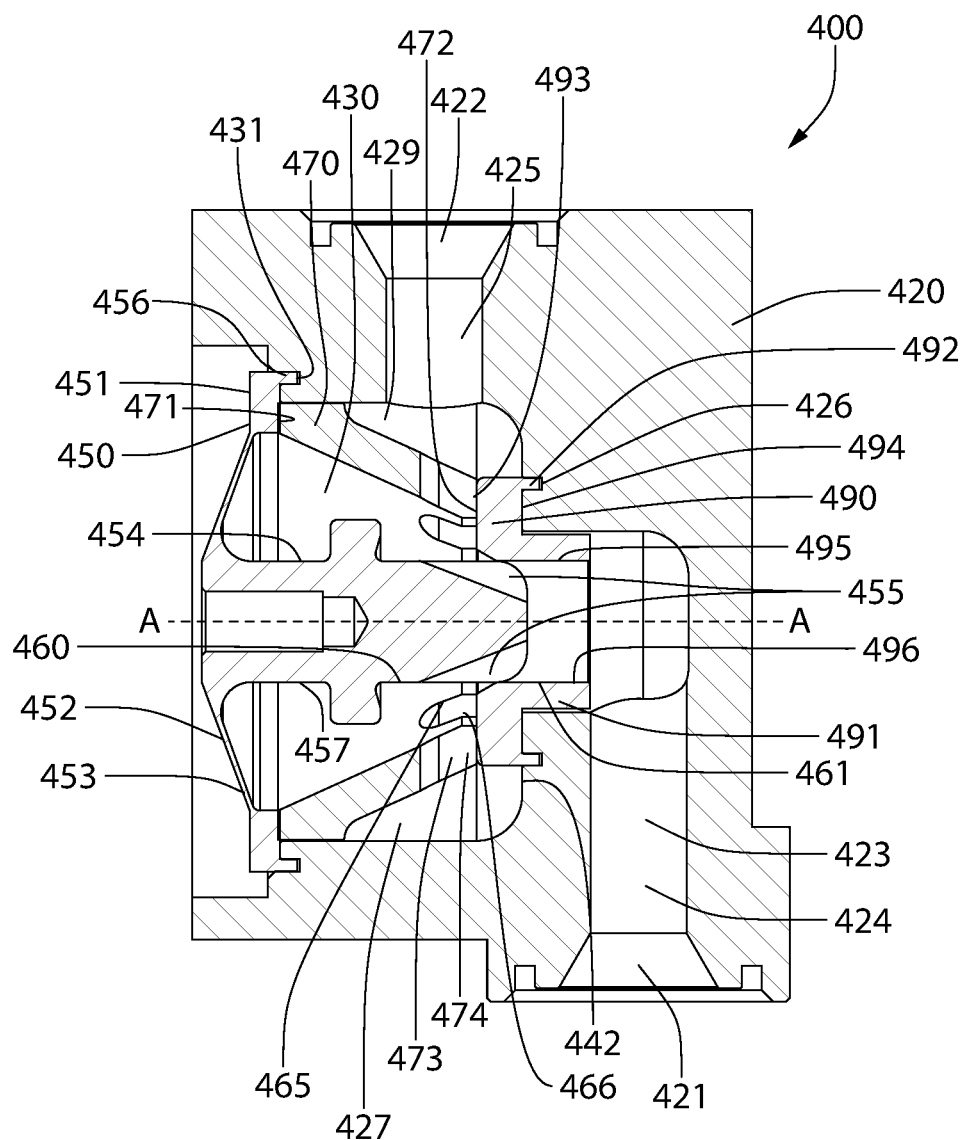
FIG. 36 is a cross-sectional view of the portion of the valve assembly of FIG. 33 in a fully open state, taken along line 34-34.

Turning to FIGS. 34 to 36, the internal components of the valve assembly 400 are shown in cross-sectional views illustrating three different states of the valve assembly 400. In FIG. 34, the valve assembly 400 is in the closed state. In FIG. 35, the valve assembly 400 is in a partially open state. In FIG. 36, the valve assembly 400 is in a fully open state. As can be understood, the partially open state is a state at which the valve assembly 400 permits flow but does not allow as much flow as when the valve assembly 400 is in the fully open state. There may be an infinite number of partially open states to allow control over the flow rate of fluid passing through the valve assembly 400 if so desired.

The valve assembly 400 further comprises a longitudinal axis A-A, a closure member 450, a radial flow guide 470, a seat 490, an inlet 421, and an outlet 422. The closure member 450 is configured to flex or otherwise move such that it can engage the seat 490 to control fluid flow through the valve body 420. Thus, fluid flows into the valve assembly 400 at the inlet 421, past the closure member 450 and the seat 490, and out of the outlet 422.

The body 420 of the valve assembly 400 comprises the inlet 421 and the outlet 422. The inlet 421 extends to the outlet 422 along a flow path 423. The flow path 423 comprises all internal volume of the body 420 of the valve assembly 400 not occupied by the closure member 450, the radial flow guide 470, or the seat 490. The flow path 423 is divided into a first volume 424 and a second volume 425. The first volume 424 comprises all internal volume of the flow path 423 from the inlet 421 to the seat 490, while the second volume 425 comprises all internal volume of the flow path 423 from the seat 490 to the outlet 422. Thus, the first volume 424 is upstream of the seat 490 while the second volume 425 is downstream of the seat 490. However, in some embodiments or implementations, the valve assembly 400 may flow fluid in the opposite direction or in both directions. The terminology above is used to reflect the most probable direction of fluid flow and aid in better understanding the workings of the valve assembly 400.

The closure member 450 is coupled to an actuator assembly as discussed in the first embodiment. As can be seen in FIGS. 34 to 36, the closure member 450 comprises a fixed portion 451 and a movable portion 452. The fixed portion 451 is sandwiched between the body 420 and a cover such as the cover 240 discussed above. This secures the closure member 450 in place, ensuring that it is retained and cannot become dislodged during operation. The movable portion 452 comprises a diaphragm 453 and a needle 454. In the present embodiment, the needle 454 is a monolithic, integrally formed, portion of the movable portion 452. In other embodiments, the diaphragm 453 may comprise a center portion which is threaded to accept the needle 454. Optionally, the needle 454 may be attached to the diaphragm 453 via any known means.

FIG. 34 illustrates a cross-sectional view of the valve assembly 400 in the closed state. The closure member 450 is shown engaging the seat 490. Specifically, the needle 454 is configured to move along the longitudinal axis A-A of the valve assembly 400 in order to engage and disengage the seat 490. As the needle 454 moves downward along the longitudinal axis A-A, it completely closes the flow path 423 and prevents fluid flow. In this condition, the valve assembly 400 is in the closed state. The needle 454 is moved when the actuator assembly pushes against the movable portion 452 of the closure member 450. Because the needle 454 is a part of the movable portion 452, the needle 454 translates along the longitudinal axis A-A.

The needle 454 engages an inner surface 496 of a boss 491 of the seat 490. The boss 491 extends along the longitudinal axis A-A. The inner surface 496 is a close fit with the needle 454 so that flow can be controlled as the insertion of the needle 454 within the boss 491 is controlled. The fit between the inner surface 496 and the needle 454 is a sliding fit, so this interface alone does not provide complete sealing when the valve assembly 400 is in the closed position. As with previously discussed embodiments, the needle 454 has a plurality of grooves 455 which allow the passage of fluid past the seat 490 when the valve assembly 400 is in the partially or fully open states. The needle 454 further comprises an outer surface 457, the outer surface 457 comprising a cylindrical portion 460 and a grooved portion 461. The grooved portion 461 comprises the grooves 455.

The seat 490 further comprises an upper surface 493, a lower surface 494, and an annular ring 492. The body 420 comprises a pocket 427 having a floor 428. The pocket 427 forms a portion of the second volume 425 of the flow path 423, with the seat 490 resting against the floor 428 of the pocket 427. Specifically, the lower surface 494 of the seat 490 rests against the floor 428 of the pocket 427 of the body 420. The body 420 also comprises a lower annular groove 426 formed into the floor 428 of the pocket 427. The lower annular groove 426 has a generally rectangular cross section and is concentric with the longitudinal axis A-A. The lower annular groove 426 receives the annular ring 492 of the seat 490. The annular ring 492 engages the lower annular groove 426 to provide a seal between the body 420 and the seat 490 and aid in alignment during assembly. In other embodiments, the lower annular groove 426 may be semi-circular, trapezoidal, or any other profile used for sealing and retention of the seat 490 against the body 420.

The needle 454 further comprises an annulus 465 extending from the outer surface 457. The annulus 465 is located adjacent the cylindrical portion 460, the cylindrical portion 460 located between the annulus 465 and the grooved portion 461. The annulus 465 has a face surface 466 which engages the upper surface 493 of the seat 490 to form a face seal. Thus, when the valve assembly 400 is in the closed position, the face surface 466 is in contact with the upper surface 493 to provide a seal, preventing flow of fluid through the valve assembly 400. As noted above, the fit between the needle 454 and the inner surface 496 of the boss 491 is not tight enough to provide complete sealing. The face surface 466 provides a seal when the valve assembly 400 is in the closed position, enabling complete flow shutoff or substantially complete flow shutoff.

The radial flow guide 470 has an upper surface 471 and a lower surface 472. The lower surface 472 of the radial flow guide 470 contacts the upper surface 493 of the seat 490. The radial flow guide 470 serves to hold the seat 490 in place. A plurality of castellations 473 are formed into the lower surface 472 of the radial flow guide 470. The plurality of castellations 473 and the upper surface 493 of the seat 490 collectively form a plurality of flow passages 474. The radial flow guide 470 divides the second volume 425 into an outer chamber 429 and an inner chamber 430. The outer chamber 429 is the portion of the second volume 425 between the inlet 421 and the radial flow guide 470. The inner chamber 430 is the portion of the first volume 424 between the radial flow guide 470 and the seat 490. When the valve assembly 400 is in the partially or fully open states, fluid flows into the inlet 421, surrounds the radial flow guide 470, passes through the plurality of flow passages 474, then flows past the needle 454 and the seat 490 to the outlet 422.

The radial flow guide 470 is held in place by the fixed portion 451 of the closure member 450. In particular, the fixed portion 451 engages the upper surface 471 of the radial flow guide 470. The fixed portion 451 is secured to the body 420 by the cover, which may be bolted to the body 420 or otherwise secured so that the entire stack of closure member 450, radial flow guide 470, and seat 490 are compressed together and cannot shift or become dislodged. The fixed portion 451, the radial flow guide 470, and the seat 490 are compressed by the cover such that they do not move, either along the longitudinal axis A-A or radially with respect to the longitudinal axis A-A. These components may be configured so that they deflect when the cover is assembled to the body 420 to facilitate effective sealing of the closure member 450 against the body 420, ensuring a fluid-tight assembly.

The body 420 further comprises an upper annular groove 431. The upper annular groove 431 is concentric with the longitudinal axis A-A and surrounds the pocket 427. The upper annular groove 431 is rectangular in cross-section. The upper annular groove 431 receives an annular ring 456 of the closure member 450 to facilitate sealing of the closure member 450 against the body 420. In other embodiments, the upper annular groove 431 may be semi-circular, trapezoidal, or any other profile used for sealing and retention of the closure member 450 against the body 420.

Turning to FIG. 35, a cross-sectional view of the valve assembly 400 in the partially open state is shown. The closure member 450 is shown retracted, with only a portion of the needle 454 in contact with the seat 490. Thus, even when in the partially open state, the needle 454 may still be partially in contact with the seat 490. As can be seen, the needle 454 is partially retracted because the diaphragm 453 of the movable portion 452 is deflected upward as compared with the position when the valve assembly 400 is in the closed position. The diaphragm 453 is approximately planar in the partially open state, allowing some fluid to pass through the grooves 455 of the needle 454.

The inner surface 496 of the boss 491 of the seat 490 is in contact with the grooved portion 461 of the needle 454. No portion of the cylindrical portion 460 is in contact with the inner surface 496. Thus, flow passages are created via the grooves 455 to allow fluid through the valve assembly 400. The inner surface 496 may not actually be in contact with the grooved portion 461, but instead may simply partially overlap the inner surface 496 of the seat 490 with respect to the longitudinal axis A-A. The cylindrical portion 460 has no overlap with the seat 490 with respect to the longitudinal axis A-A as shown. Thus, the portion of the grooves 455 that are exposed form the flow passages that allow fluid flow. In the partially open state, less than an entirety of the grooves 455 are exposed.

Turning to FIG. 36, a cross-sectional view of the valve assembly 400 in the fully open state is shown. The closure member 450 is shown fully retracted, with only a portion of the needle 454 in contact with the seat 490. Thus, even when in the fully open state, the needle 454 may still be partially in contact with the seat 490. Optionally, the valve assembly 400 may be configured such that the needle 454 completely or nearly completely withdraws from the seat 490 when in the open state. As can be seen, the needle 454 is retracted because the diaphragm 453 of the movable portion 452 is deflected upward as compared with the position when the valve assembly 400 is in the partially open or closed positions. The diaphragm 453 adopts a generally convex conical shape in the fully open state, allowing free flow of fluid through the grooves 455 of the needle 454. The inner surface 496 of the boss 491 of the seat 490 is in contact with the grooved portion 461 of the needle 454, creating flow passages via the grooves 455 to allow fluid through the valve assembly 400. As can be seen, there is a greater area for fluid to flow as a result of a greater retraction of the needle 454 as compared with the partially open state.

Figure 37:
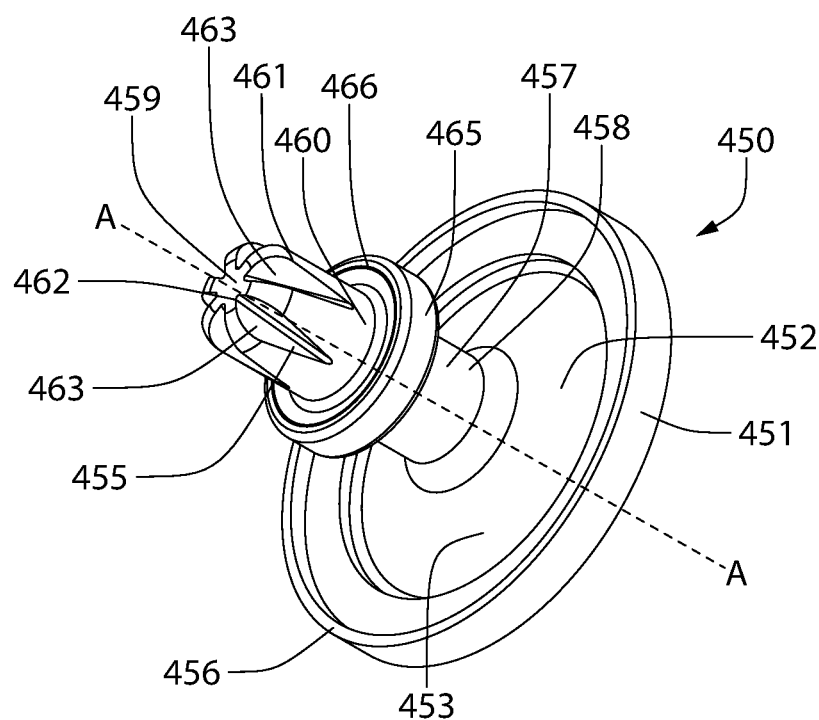
FIG. 37 is a perspective view of a closure member of the valve assembly of FIG. 33.
Figure 38:
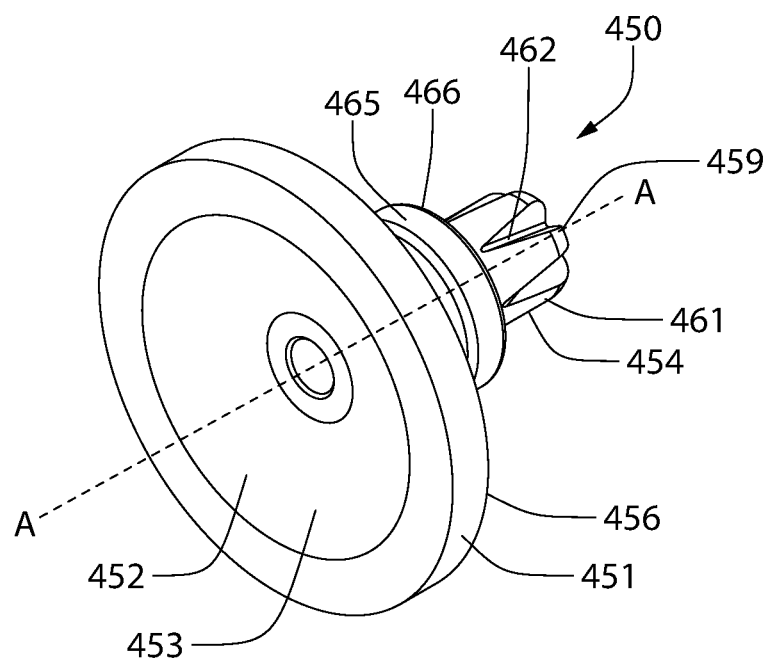
FIG. 38 is a bottom perspective view of the closure member of FIG. 37.

FIGS. 37 and 38 show the closure member 450 in greater detail. The closure member 450 is constructed with the fixed portion 451 circumferentially surrounding the movable portion 452. The movable portion 452 includes the diaphragm 453 and the needle 454. The diaphragm 453 is a thin disc of material which is joined to the fixed portion 451 at the outside and the needle 454 at the inside. Thus, the diaphragm 453 can deflect, allowing movement of the needle 454 in a longitudinal direction. The needle 454 can then move axially along the longitudinal axis A-A as illustrated previously, allowing the valve assembly 400 to transition from the closed state to the fully open state and all positions between the closed state and the fully open state. The fixed portion 451 further incorporates the annular ring 456, the annular ring 456 providing both alignment and sealing functions when engaging the upper annular groove 431 of the body 420.

The needle 454 further incorporates an outer surface 457, the outer surface 457 having the annulus 465, the cylindrical portion 460, and the grooved portion 461. The annulus 465 is adjacent the diaphragm 453. The cylindrical portion 460 is between the annulus 465 and the grooved portion 461. The grooved portion 461 is separated from the diaphragm 453 by the cylindrical portion 460 and the annulus 465. The needle 454 extends from a top end 458 to a bottom end 459. The top end 458 is adjacent the diaphragm 453. Thus, the annulus 465 is adjacent the top end 458 while the grooved portion 461 is adjacent the bottom end 459.

The annulus 465 forms a flange having an increased diameter as compared with the cylindrical portion 460. The annulus 465 has a face surface 466 as discussed previously. The cylindrical portion 460 has a cylindrical surface which is uninterrupted by grooves 455 extending from the annulus 465 to the grooved portion 461. The grooved portion 461 has a cylindrical surface which is broken by grooves 455.

Whenever the grooved portion 461 is at least partially retracted from the inner surface 496 of the boss 491 of the seat 490, fluid may pass through the grooves 455 and flow through the valve assembly 400. When the cylindrical portion 460 radially overlaps the inner surface 496 of the boss 491 and the face surface 466 is in contact with the upper surface 493, no fluid can pass through the valve assembly 400 when the valve assembly 400 is in the closed state. The cylindrical portion 460 has a first diameter, the grooved portion 461 has a second diameter, and the annulus 465 has a third diameter. Each of the first and second diameters being equal while the third diameter is greater than the first and second diameters. This results in a smooth and continuous outer surface 457 at the cylindrical portion 460 and the grooved portion 461 except at the bottom end 459 of the needle 454 where the outer surface 457 transitions to the bottom end 459. In the closed state, the face surface 466 of the needle 454 contacts the upper surface 493 of the seat 490, forming a face seal.

As can be seen, the bottom end 459 of the needle 454 meets the outer surface 457 by way of a radius. The radius ensures that the needle 454 engages the inner surface 496 of the boss 491 if the needle 454 becomes fully withdrawn from the seat 490. In alternate configurations, the needle 454 may have a taper or other shape which assists with alignment of the needle 454 and the seat 490. In the present embodiment, the bottom end 459 is planar. However, it is also conceived that the bottom end 459 may be pointed or concave.

As with the needle 254, each of the grooves 455 extends along a groove axis which is at an acute angle with respect to the longitudinal axis A-A. Each of the grooves 455 has a bottom surface 462 and a pair of side surfaces 463. In the present embodiment, the bottom surfaces 462 are arcuate, while the side surfaces 463 are planar. In other embodiments, the bottom surfaces 462 may be planar and the side surfaces 463 may be arcuate. Alternately, the bottom surfaces 462 may form a plurality of lines having a negligible curvature and the side surfaces 463 may be planar. The grooves 455 may have a variety of cross-sectional profiles, including different profiles on the same needle 454. In addition, the grooves 455 need not have a straight progression through the needle 454. Instead, the grooves 455 may be curved or angled about the longitudinal axis A-A such that they produce a swirling action in the flow of the fluid. Yet other configurations are contemplated.

In the present embodiment, the bottom surfaces 462 of the grooves 455 have an increasing radial distance from the longitudinal axis with increasing distance from the bottom end 459. The angle may vary, with different angles being used in different embodiments or even different angles in different grooves 455 on the same needle 454. The grooves 455 may also terminate at different heights, as measured from the bottom end 459 to the top of the respective groove 455. In each case, the grooves 455 are constructed to yield an orifice area across the seat 490 that varies with increasing displacement of the needle 454 from the closed state to the open state. Thus, the groove angles, the depth of the grooves 455, the shape of the grooves, and the end points of the grooves 455 may be varied in any configuration necessary to achieve the desired orifice area and resulting flow characteristics for a given application.

Figure 39:
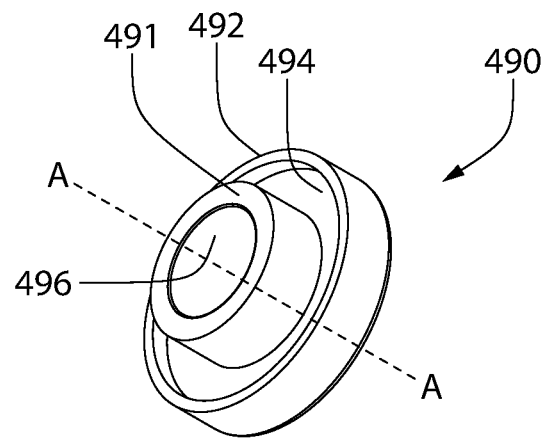
FIG. 39 is a perspective view of a seat of the valve assembly of FIG. 33.
Figure 40:
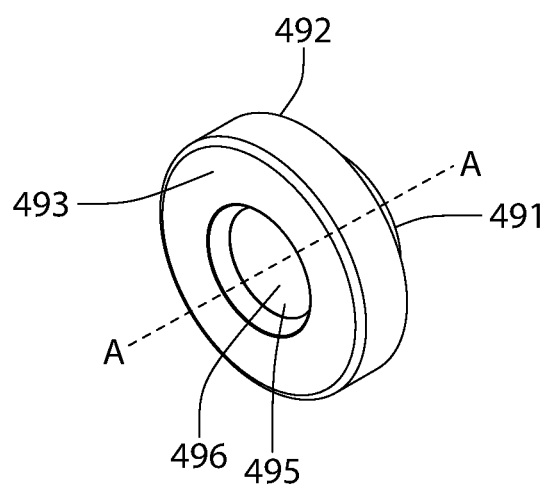
FIG. 40 is a bottom perspective view of the seat of FIG. 39.

FIGS. 39 and 40 illustrate the seat 490. The seat 490 extends from the upper surface 493 to the lower surface 494. The annular ring 492 extends from the lower surface 494 and is generally concentric about the longitudinal axis A-A. The seat 490 further includes a boss 491 extending from the lower surface 493 and defining a central aperture 495. The central aperture 495 of the boss 491 has an inner surface 496 that is substantially cylindrical. The inner surface 496 of the central aperture 495 may be a close sliding fit with the needle 454 to allow effective control of flow when in the partially open state.

Figure 41:
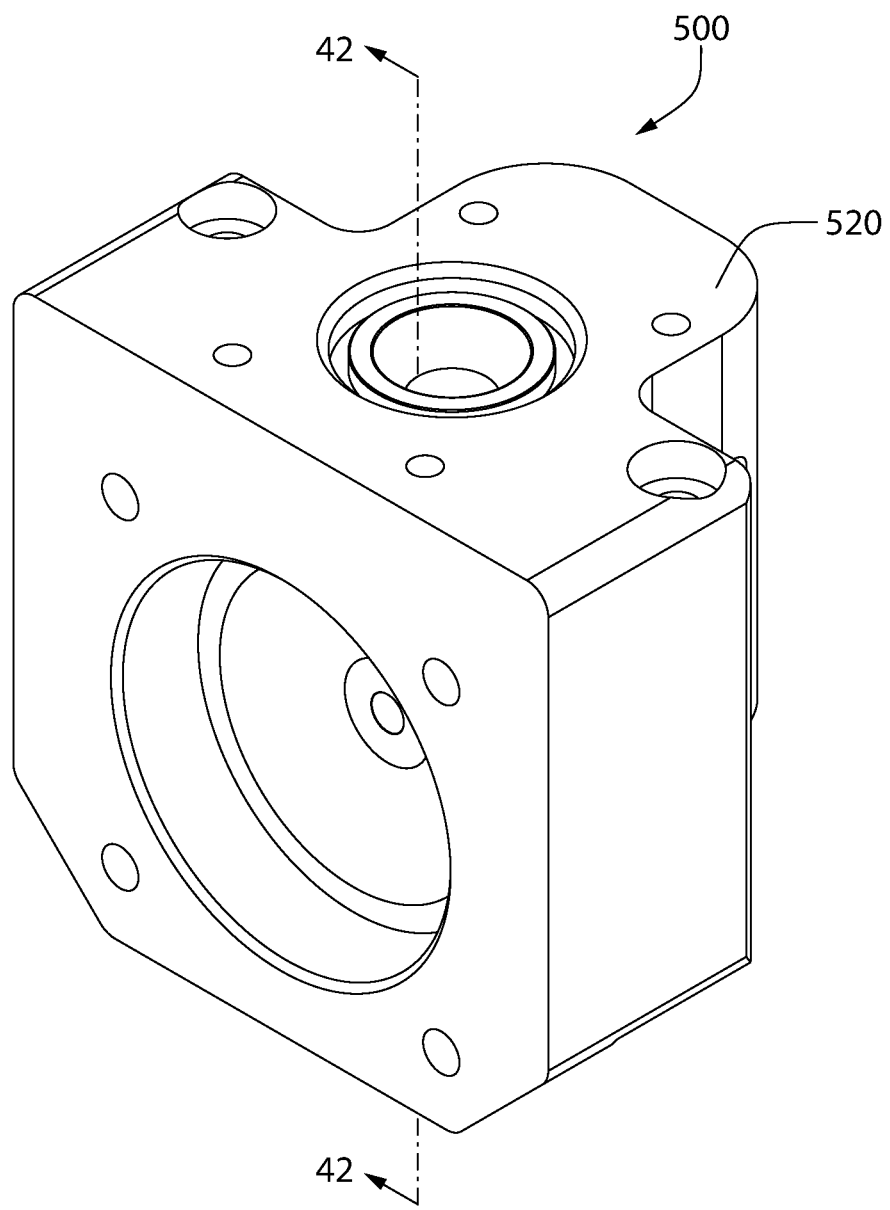
FIG. 41 is a perspective view illustrating a portion of another embodiment of a valve assembly.

Turning to FIGS. 41-46, another embodiment of a valve assembly 500 is shown with the actuator assembly omitted. FIG. 41 shows a perspective view of the valve assembly 500, the valve assembly 500 comprising a valve body 520 housing the components which define the fluid flow path and enable control of fluid flow. The valve assembly 500 may be an on/off valve, a proportional valve, or any other known type of valve and may be operated via an actuator assembly such as the actuator assembly 210 discussed above. The valve assembly 500 transitions from an open state to a closed state. Otherwise stated, the valve assembly 500 transitions from an open position to a closed position. Optionally, the valve assembly 500 may also be operated in any number of intermediate states between the open state and the closed state. For instance, the valve assembly 500 may be a proportional valve capable of providing a range of flow between the open state and the closed state. In the open state, fluid is free to flow through the valve assembly 500. In the closed state, fluid is blocked from flowing through the valve assembly 500. The valve assembly 500 may also permit flow at all intermediate states between the open state and the closed state. Optionally, the valve body 520 may be an integrally formed monolithic component. The valve assembly 500 may be one of a plurality of components that collectively form an apparatus for controlling flow 100.

Figure 42:
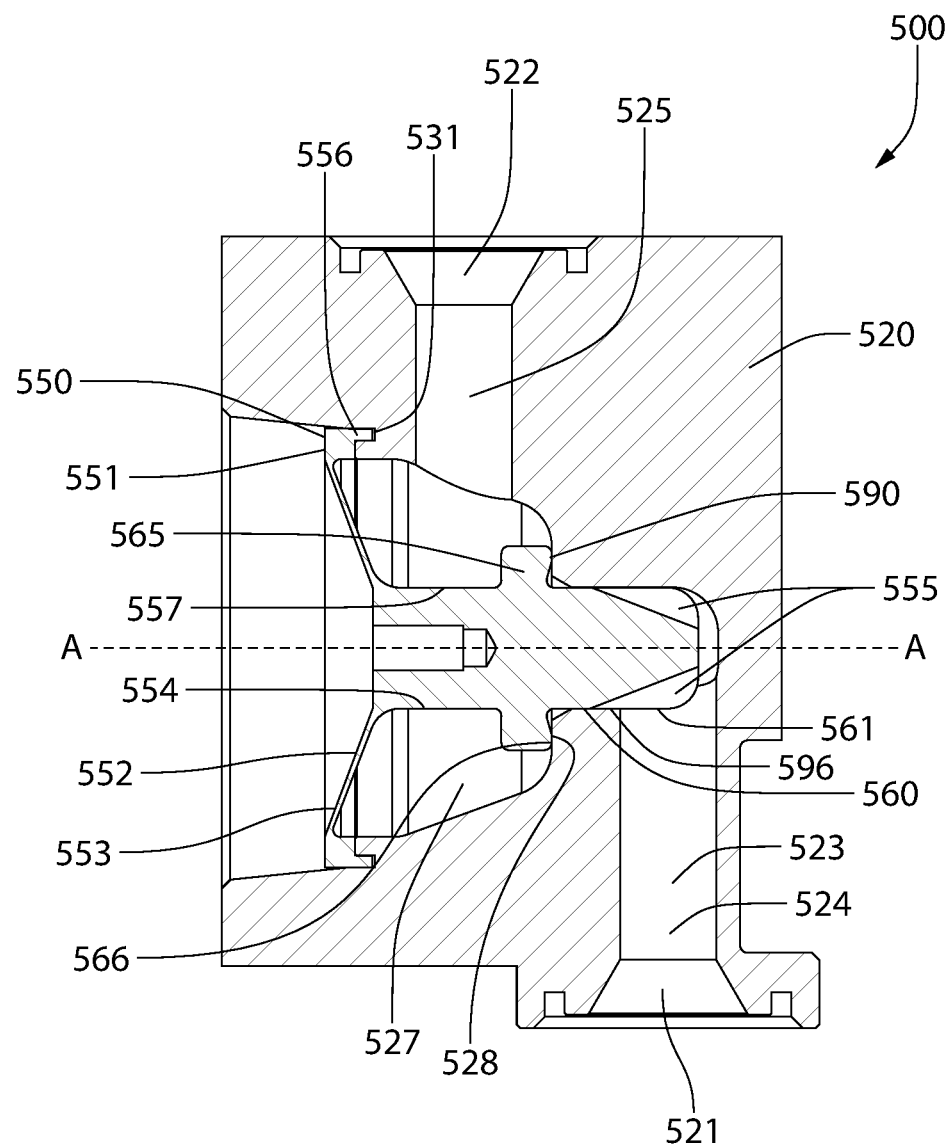
FIG. 42 is a cross-sectional view of the portion of the valve assembly of FIG. 41 in a fully closed state, taken along line 42-42.
Figure 43:
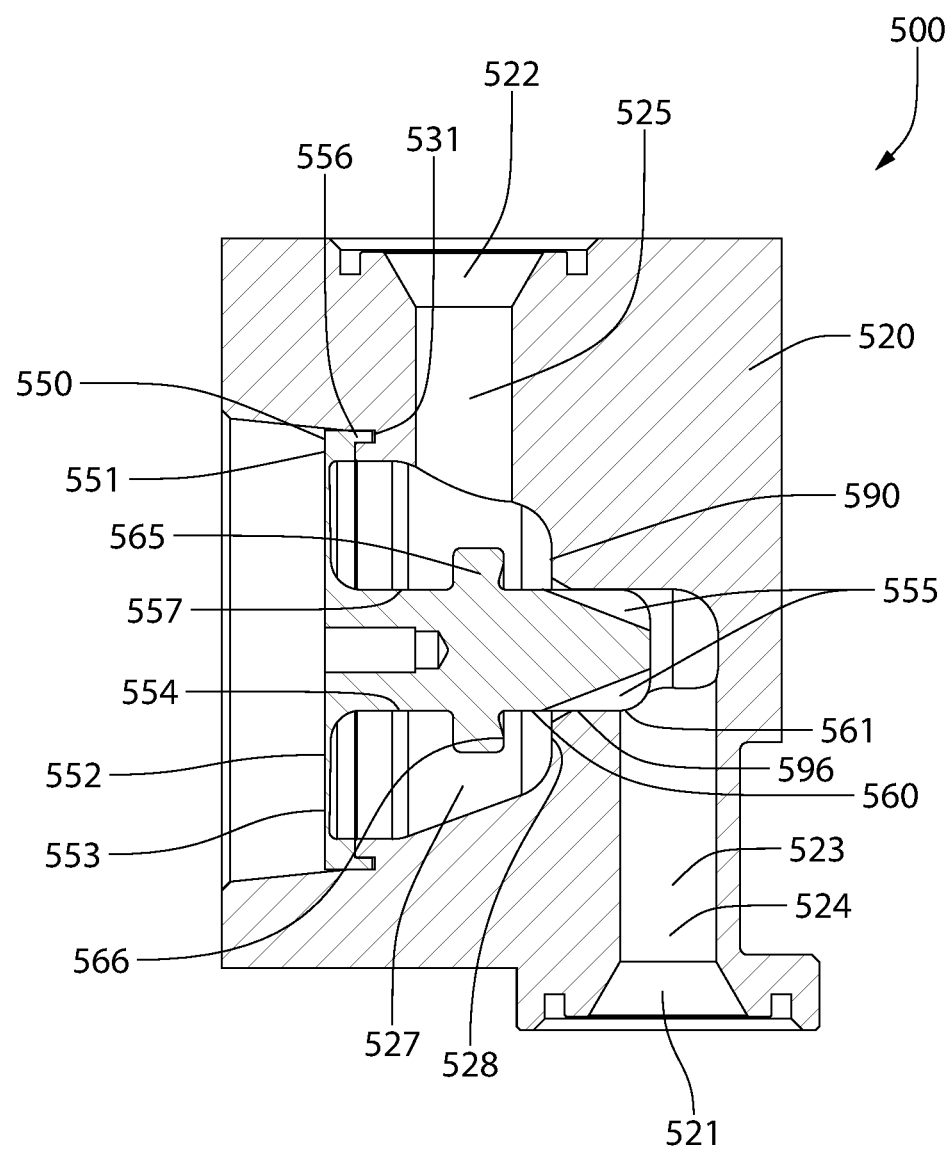
FIG. 43 is a cross-sectional view of the portion of the valve assembly of FIG. 41 in a partially open state, taken along line 42-42.
Figure 44:
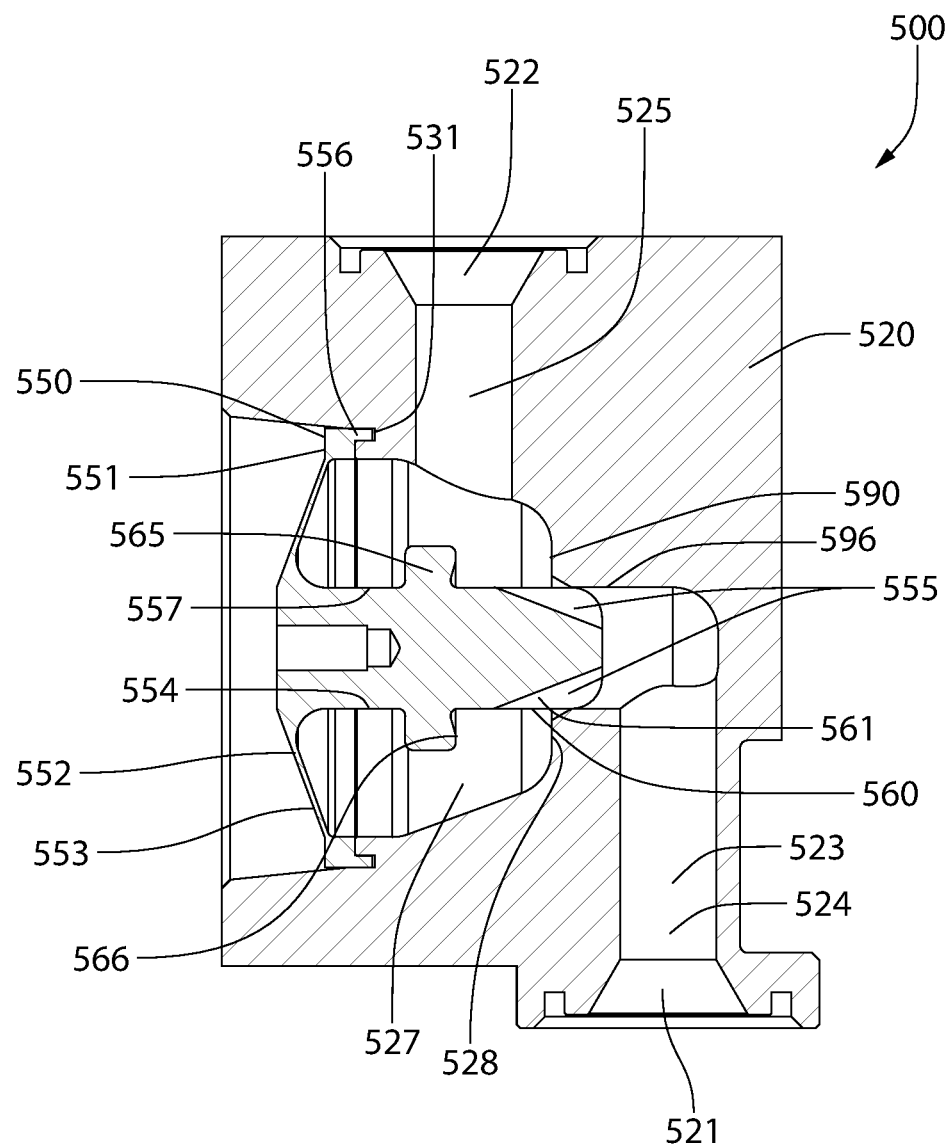
FIG. 44 is a cross-sectional view of the portion of the valve assembly of FIG. 41 in a fully open state, taken along line 42-42.

Turning to FIGS. 42 to 44, the internal components of the valve assembly 500 are shown in cross-sectional views illustrating three different states of the valve assembly 500. In FIG. 42, the valve assembly 500 is in the closed state. In FIG. 43, the valve assembly 500 is in a partially open state. In FIG. 44, the valve assembly 500 is in a fully open state. As can be understood, the partially open state is a state at which the valve assembly 500 permits flow but does not allow as much flow as when the valve assembly 500 is in the fully open state. There may be an infinite number of partially open states to allow control over the flow rate of fluid passing through the valve assembly 500 if so desired.

The valve assembly 500 further comprises a longitudinal axis A-A, a closure member 550, an inlet 521, and an outlet 522. The closure member 550 is configured to flex or otherwise move such that it can engage a seat 590 to control fluid flow through the valve body 520. Thus, fluid flows into the valve assembly 500 at the inlet 521, past the closure member 550 and the seat 590, and out of the outlet 522. In the present embodiment, the seat 590 is integrally formed and is a portion of the valve body 520 which engages the closure member 550.

The body 520 of the valve assembly 500 comprises the inlet 521 and the outlet 522. The inlet 521 extends to the outlet 522 along a flow path 523. The flow path 523 comprises all internal volume of the body 520 of the valve assembly 500 not occupied by the closure member 550. The flow path 523 is divided into a first volume 524 and a second volume 525. The first volume 524 comprises all internal volume of the flow path 523 from the inlet 521 to the seat 590, while the second volume 525 comprises all internal volume of the flow path 523 from the seat 590 to the outlet 522. Thus, the first volume 524 is upstream of the seat 590 while the second volume 525 is downstream of the seat 590. However, in some embodiments or implementations, the valve assembly 500 may flow fluid in the opposite direction or in both directions. The terminology above is used to reflect the most probable direction of fluid flow and aid in better understanding the workings of the valve assembly 500.

The closure member 550 is coupled to an actuator assembly as discussed in the first embodiment. As can be seen in FIGS. 42 to 44, the closure member 550 comprises a fixed portion 551 and a movable portion 552. The fixed portion 551 is sandwiched between the body 520 and a cover such as the cover 240 discussed above. This secures the closure member 550 in place, ensuring that it is retained and cannot become dislodged during operation. The movable portion 552 comprises a diaphragm 553 and a needle 554. In the present embodiment, the needle 554 is a monolithic, integrally formed, portion of the movable portion 552. In other embodiments, the diaphragm 553 may comprise a center portion which is threaded to accept the needle 554. Optionally, the needle 554 may be attached to the diaphragm 553 via any known means.

FIG. 42 illustrates a cross-sectional view of the valve assembly 500 in the closed state. The closure member 550 is shown engaging the seat 590, the seat 590 being the portion of the body 520 which enables sealing when contacted by the closure member 550. Specifically, the needle 554 is configured to move along the longitudinal axis A-A of the valve assembly 500 in order to engage and disengage the seat 590. As the needle 554 moves downward along the longitudinal axis A-A, it completely closes the flow path 523 and prevents fluid flow. In this condition, the valve assembly 500 is in the closed state. The needle 554 is moved when the actuator assembly pushes against the movable portion 552 of the closure member 550. Because the needle 554 is a part of the movable portion 552, the needle 554 translates along the longitudinal axis A-A.

The needle 554 engages an inner surface 596 of the seat 490. The inner surface 596 is a close fit with the needle 554 so that flow can be controlled as the insertion of the needle 554 within the seat 590 is controlled. The fit between the inner surface 596 and the needle 554 is a sliding fit, so this interface alone does not provide complete sealing when the valve assembly 500 is in the closed position. As with previously discussed embodiments, the needle 554 has a plurality of grooves 555 which allow the passage of fluid past the seat 590 when the valve assembly 500 is in the partially or fully open states. The needle 554 further comprises an outer surface 557, the outer surface 557 comprising a cylindrical portion 560 and a grooved portion 561. The grooved portion 561 comprises the grooves 555.

The body 520 comprises a pocket 527 having a floor 528. The pocket 527 forms a portion of the second volume 525 of the flow path 523. The floor 528 forms a portion of the seat 490, in combination with the inner surface 596. Thus, the floor 528 is a portion of the pocket 527 and the seal 590 simultaneously.

The needle 554 further comprises an annulus 565 extending from the outer surface 557. The annulus 565 is located adjacent the cylindrical portion 560, the cylindrical portion 560 located between the annulus 565 and the grooved portion 561. The annulus 565 has a face surface 566 which engages the floor 528 to form a face seal. Thus, when the valve assembly 500 is in the closed position, the face surface 566 is in contact with the floor 528 to provide a seal, preventing flow of fluid through the valve assembly 500. As noted above, the fit between the needle 554 and the inner surface 596 of the seal 590 is not tight enough to provide complete sealing. The face surface 566 provides a seal when the valve assembly 500 is in the closed position, enabling complete flow shutoff or substantially complete flow shutoff.

The body 520 further comprises an upper annular groove 531. The upper annular groove 531 is concentric with the longitudinal axis A-A and surrounds the pocket 527. The upper annular groove 531 is rectangular in cross-section. The upper annular groove 531 receives an annular ring 556 of the closure member 550 to facilitate sealing of the closure member 550 against the body 520. In other embodiments, the upper annular groove 531 may be semi-circular, trapezoidal, or any other profile used for sealing and retention of the closure member 550 against the body 520.

Turning to FIG. 43, a cross-sectional view of the valve assembly 500 in the partially open state is shown. The closure member 550 is shown retracted, with only a portion of the needle 554 in contact with the seat 590. Thus, even when in the partially open state, the needle 554 may still be partially in contact with the seat 590. As can be seen, the needle 554 is partially retracted because the diaphragm 553 of the movable portion 552 is deflected upward as compared with the position when the valve assembly 500 is in the closed position. The diaphragm 553 is approximately planar in the partially open state, allowing some fluid to pass through the grooves 555 of the needle 554.

The inner surface 596 of the seat 590 is in contact with the grooved portion 561 of the needle 554. No portion of the cylindrical portion 560 is in contact with the inner surface 596. Thus, flow passages are created via the grooves 555 to allow fluid through the valve assembly 500. The inner surface 596 may not actually be in contact with the grooved portion 561, but instead may simply partially overlap the inner surface 596 of the seat 590 with respect to the longitudinal axis A-A. The cylindrical portion 560 has no overlap with the seat 590 with respect to the longitudinal axis A-A as shown. Thus, the portion of the grooves 555 that are exposed form the flow passages that allow fluid flow. In the partially open state, less than an entirety of the grooves 555 are exposed.

Turning to FIG. 44, a cross-sectional view of the valve assembly 500 in the fully open state is shown. The closure member 550 is shown fully retracted, with only a portion of the needle 554 in contact with the seat 590. Thus, even when in the fully open state, the needle 554 may still be partially in contact with the seat 590. Optionally, the valve assembly 500 may be configured such that the needle 554 completely or nearly completely withdraws from the seat 590 when in the open state. As can be seen, the needle 554 is retracted because the diaphragm 553 of the movable portion 552 is deflected upward as compared with the position when the valve assembly 500 is in the partially open or closed positions. The diaphragm 553 adopts a generally convex conical shape in the fully open state, allowing free flow of fluid through the grooves 555 of the needle 554. The inner surface 596 of the seat 590 is in contact with the grooved portion 561 of the needle 554, creating flow passages via the grooves 555 to allow fluid through the valve assembly 500. As can be seen, there is a greater area for fluid to flow as a result of a greater retraction of the needle 554 as compared with the partially open state.

Figure 45:
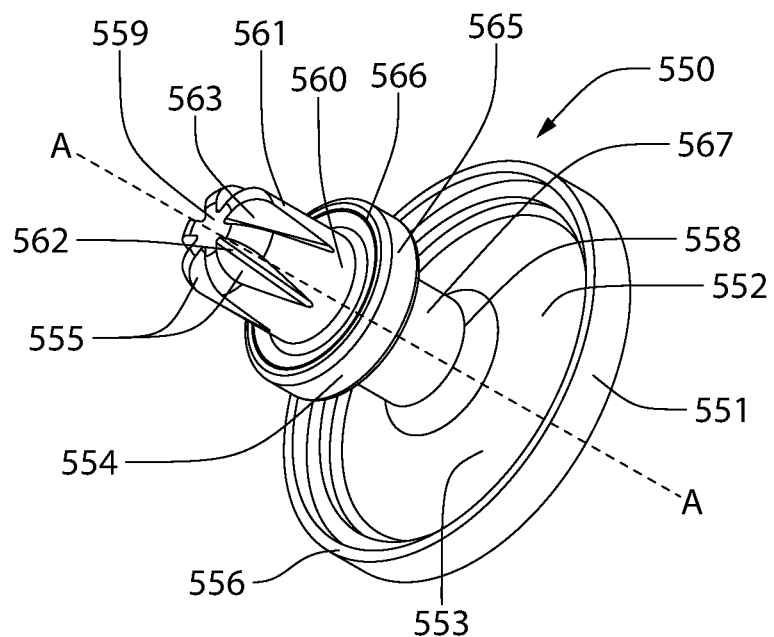
FIG. 45 is a perspective view of a closure member of the valve assembly of FIG. 41.
Figure 46:
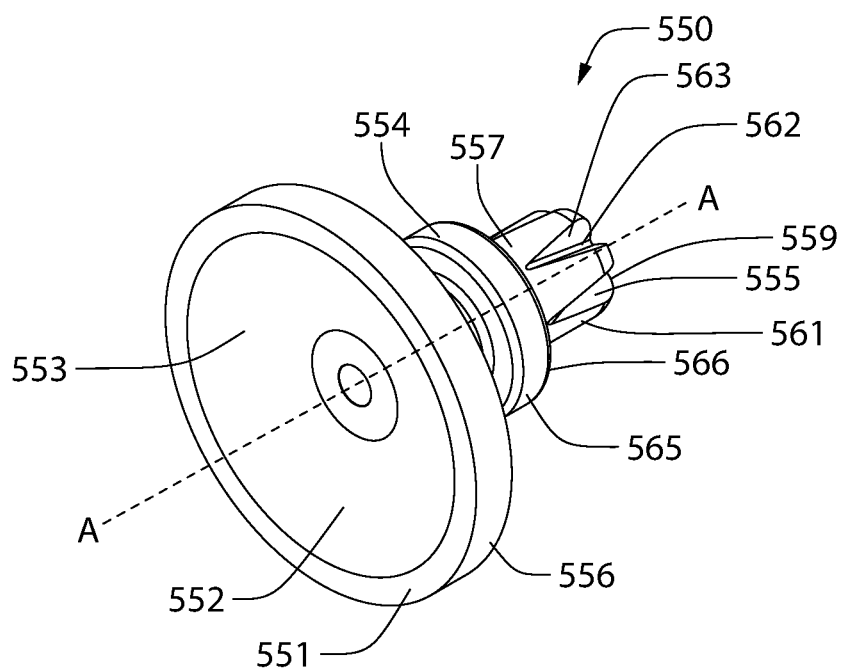
FIG. 46 is a bottom perspective view of the closure member of FIG. 45.

FIGS. 45 and 46 show the closure member 550 in greater detail. The closure member 550 is constructed with the fixed portion 551 circumferentially surrounding the movable portion 552. The movable portion 552 includes the diaphragm 553 and the needle 554. The diaphragm 553 is a thin disc of material which is joined to the fixed portion 551 at the outside and the needle 554 at the inside. Thus, the diaphragm 553 can deflect, allowing movement of the needle 554 in a longitudinal direction. The needle 554 can then move axially along the longitudinal axis A-A as illustrated previously, allowing the valve assembly 500 to transition from the closed state to the fully open state and all positions between the closed state and the fully open state. The fixed portion 551 further incorporates the annular ring 556, the annular ring 556 providing both alignment and sealing functions when engaging the upper annular groove 531 of the body 520.

The needle 554 further incorporates an outer surface 557, the outer surface 557 having the annulus 565, the cylindrical portion 560, and the grooved portion 561. The annulus 565 is adjacent the diaphragm 553. The cylindrical portion 560 is between the annulus 565 and the grooved portion 561. The grooved portion 561 is separated from the diaphragm 553 by the cylindrical portion 560 and the annulus 565. The needle 554 extends from a top end 558 to a bottom end 559. The top end 558 is adjacent the diaphragm 553. Thus, the annulus 565 is adjacent the top end 558 while the grooved portion 561 is adjacent the bottom end 559.

The annulus 565 forms a flange having an increased diameter as compared with the cylindrical portion 560. The annulus 565 has a face surface 566 as discussed previously. The cylindrical portion 560 has a cylindrical surface which is uninterrupted by grooves 555 extending from the annulus 565 to the grooved portion 561. The grooved portion 561 has a cylindrical surface which is broken by grooves 555.

Whenever the grooved portion 561 is at least partially retracted from the inner surface 596 of the seat 590, fluid may pass through the grooves 555 and flow through the valve assembly 500. When the cylindrical portion 560 radially overlaps the inner surface 596 of the seat 590 and the face surface 566 is in contact with the floor 528, no fluid can pass through the valve assembly 500 when the valve assembly 500 is in the closed state. The cylindrical portion 560 has a first diameter, the grooved portion 561 has a second diameter, and the annulus 565 has a third diameter. Each of the first and second diameters being equal while the third diameter is greater than the first and second diameters. This results in a smooth and continuous outer surface 557 at the cylindrical portion 560 and the grooved portion 561 except at the bottom end 559 of the needle 554 where the outer surface 557 transitions to the bottom end 559. In the closed state, the face surface 566 of the needle 554 contacts the floor 528, forming a face seal.

As can be seen, the bottom end 559 of the needle 554 meets the outer surface 557 by way of a radius. The radius ensures that the needle 554 engages the inner surface 596 of the seat 590 if the needle 554 becomes fully withdrawn from the seat 590. In alternate configurations, the needle 454 may have a taper or other shape which assists with alignment of the needle 554 and the seat 590. In the present embodiment, the bottom end 559 is planar. However, it is also conceived that the bottom end 559 may be pointed or concave.

As with the needle 254, each of the grooves 555 extends along a groove axis which is at an acute angle with respect to the longitudinal axis A-A. Each of the grooves 555 has a bottom surface 562 and a pair of side surfaces 563. In the present embodiment, the bottom surfaces 562 are arcuate, while the side surfaces 563 are planar. In other embodiments, the bottom surfaces 562 may be planar and the side surfaces 563 may be arcuate. Alternately, the bottom surfaces 562 may form a plurality of lines having a negligible curvature and the side surfaces 563 may be planar. The grooves 555 may have a variety of cross-sectional profiles, including different profiles on the same needle 554. In addition, the grooves 555 need not have a straight progression through the needle 554. Instead, the grooves 555 may be curved or angled about the longitudinal axis A-A such that they produce a swirling action in the flow of the fluid. Yet other configurations are contemplated.

In the present embodiment, the bottom surfaces 562 of the grooves 555 have an increasing radial distance from the longitudinal axis with increasing distance from the bottom end 559. The angle may vary, with different angles being used in different embodiments or even different angles in different grooves 555 on the same needle 554. The grooves 555 may also terminate at different heights, as measured from the bottom end 559 to the top of the respective groove 555. In each case, the grooves 555 are constructed to yield an orifice area across the seat 590 that varies with increasing displacement of the needle 554 from the closed state to the open state. Thus, the groove angles, the depth of the grooves 555, the shape of the grooves, and the end points of the grooves 555 may be varied in any configuration necessary to achieve the desired orifice area and resulting flow characteristics for a given application.

While the invention has been described with respect to specific examples including presently preferred modes of carrying out the invention, those skilled in the art will appreciate that there are numerous variations and permutations of the above-described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A system for processing articles, the system comprising:
    a fluid supply configured to supply a process fluid;
    an apparatus for controlling flow, the apparatus having an inlet, an outlet, and a valve assembly, the inlet of the apparatus fluidly coupled to the fluid supply and the valve assembly fluidly coupled between the inlet and the outlet, the valve assembly comprising:
        a body, the body comprising an inlet and an outlet, a flow path extending between the inlet and the outlet through a pocket within the body;
        a seat having an annular ring extending from a lower surface of the seat, the seat located in the flow path and resting on a floor of the pocket, the annular ring of the seat engaging an annular groove formed in the floor of the pocket;
        a closure member configured to engage the seat and obstruct the flow path, the closure member comprising a fixed portion and a movable portion connected to the fixed portion;
        an actuator assembly coupled to the movable portion of the closure member to move the closure member from a closed state which obstructs the flow path to an open state which permits fluid flow;
        a radial flow guide located in the flow path, a plurality of flow passages extending through the radial flow guide, the plurality of flow passages defined by the radial flow guide and the seat, the radial flow guide compressed between the seat and the fixed portion of the closure member, the fixed portion of the closure member sealing an opening of the pocket and engaging an upper surface of the radial flow guide; and
        a longitudinal axis extending through the seat, the closure member, and the radial flow guide;
    an outlet manifold fluidly coupled to the outlet of the apparatus; and
    a processing chamber fluidly coupled to the outlet manifold.

2. The system of claim 1 wherein the closure member comprises a diaphragm and a needle.

3. The system of claim 1 wherein the fixed portion is directly coupled to the body.

4. The system of claim 1 wherein the flow path comprises a first volume extending from the inlet of the body to the seat, the first volume defined by the body, the seat, and the closure member.

5. The system of claim 4 wherein the flow path further comprises a second volume extending from the seat to the outlet of the body, the second volume defined by the body, the seat, and the closure member.

6. The system of claim 4 wherein the radial flow guide divides the first volume into an outer chamber and an inner chamber, the plurality of flow passages extending from the outer chamber to the inner chamber and wherein the plurality of flow passages are defined by the seat and a plurality of castellations formed into the radial flow guide.

7. The system of claim 1 wherein the radial flow guide extends from the upper surface to a lower surface along the longitudinal axis of the valve assembly, the radial flow guide comprising a plurality of castellations formed in the lower surface.

8. The system of claim 1 wherein the closure member comprises a diaphragm and a needle, the needle comprising a top end, a bottom end, a cylindrical portion and a grooved portion, the longitudinal axis of the valve assembly extending from the top end to the bottom end, the grooved portion extending from the bottom end to the cylindrical portion, and the grooved portion comprising a plurality of grooves.

9. The system of claim 8 wherein the cylindrical portion comprises a first diameter and the grooved portion comprises a second diameter, the first and second diameters being equal.

10. The system of claim 8 wherein the plurality of grooves are equally spaced about the longitudinal axis.

11. The system of claim 8 wherein each of the plurality of grooves comprise a bottom surface, the bottom surface having a radial distance from the longitudinal axis that increases with increasing distance from the bottom end of the needle.

12. The system of claim 1 wherein the seat has a sealing lip extending from an upper surface of the seat, the radial flow guide compressed between the upper surface of the seat and a fixed portion of the closure member.

13. The system of claim 1 wherein the radial flow guide is positioned in the flow path intermediate the inlet of the body and the seat of the valve assembly.

14. An apparatus for controlling flow, the apparatus comprising:
  an inlet;
  an outlet; and
  a valve assembly, the valve assembly fluidly coupled between the inlet and the outlet, the valve assembly comprising:
    a body, the body comprising an inlet and an outlet, a flow path extending between the inlet and the outlet;
    a seat located in the flow path, the seat having a sealing lip extending from an upper surface of the seat;
    a closure member configured to engage the seat and obstruct the flow path, the closure member comprising a fixed portion directly coupled to the body and a movable portion which is configured to move with respect to the body;
    an actuator assembly coupled to the movable portion of the closure member to move the movable portion of the closure member from a closed state which obstructs the flow path to an open state which permits fluid flow;
    a radial flow guide located in the flow path, the radial flow guide comprising a plurality of grooves having an open profile, a plurality of flow passages at least partially defined by the grooves, the radial flow guide in direct contact with the upper surface of the seat, the fixed portion of the closure member in direct contact with the radial flow guide, the fixed portion of the closure member in direct contact with an upper surface of the radial flow guide, the radial flow guide sandwiched between the fixed portion of the closure member and the upper surface of the seat; and
    a longitudinal axis extending through the seat, the closure member, and the radial flow guide.

15. The apparatus of claim 14 wherein the flow path comprises a first volume extending from the inlet of the body to the seat, the first volume defined by the body, the seat, and the closure member, and wherein the flow path further comprises a second volume extending from the seat to the outlet of the body, the second volume defined by the body, the seat, and the closure member.

16. The apparatus of claim 15 wherein the radial flow guide divides the first volume into an outer chamber and an inner chamber, the plurality of flow passages extending from the outer chamber to the inner chamber, and wherein the plurality of flow passages are defined by the seat and the plurality of grooves.

17. The apparatus of claim 14 wherein the closure member comprises a diaphragm and a needle, the needle comprising a top end, a bottom end, a cylindrical portion and a grooved portion, the longitudinal axis of the valve assembly extending from the top end to the bottom end, the grooved portion extending from the bottom end to the cylindrical portion, and the grooved portion comprising a plurality of grooves, and wherein the plurality of grooves of the grooved portion are circumferentially spaced about the longitudinal axis.

18. The apparatus of claim 14 wherein the closure member comprises a plurality of grooves and the radial flow guide defines at least a portion of the plurality of flow passages, the plurality of flow passages being greater in number than the plurality of grooves.

19. The apparatus of claim 14 wherein the closure member comprises a plurality of grooves and the radial flow guide defines at least a portion of the plurality of flow passages, the plurality of flow passages being rotationally aligned with the plurality of grooves.

20. The system of claim 14 wherein the body comprises a pocket, the pocket comprising a floor and an annular groove formed in the floor, an annular ring of the seat engaging the annular groove of the floor of the pocket.

21. The system of claim 14 wherein the radial flow guide is positioned in the flow path intermediate the inlet of the body and the seat of the valve assembly.

22. A system for processing articles, the system comprising:
  a fluid supply configured to supply a process fluid;
  an apparatus for controlling flow, the apparatus having an inlet, an outlet, and a valve assembly, the inlet of the apparatus fluidly coupled to the fluid supply and the valve assembly fluidly coupled between the inlet and the outlet, the valve assembly comprising:
    a body, the body comprising an inlet and an outlet, a flow path extending between the inlet and the outlet;
    a seat located in the flow path;
    a closure member configured to engage the seat and obstruct the flow path, the closure member comprising a diaphragm and a needle, the needle comprising a top end, a bottom end, a cylindrical portion and a grooved portion, the grooved portion extending from the bottom end to the cylindrical portion, and the grooved portion comprising a plurality of grooves;
    an actuator assembly coupled to the closure member to move the closure member from a closed state which obstructs the flow path to an open state which permits fluid flow;
    a radial flow guide, the radial flow guide having a plurality of grooves forming a portion of the flow path; and
    a longitudinal axis extending through the seat and the closure member;
  an outlet manifold fluidly coupled to the outlet of the apparatus; and
  a processing chamber fluidly coupled to the outlet manifold;
  wherein the plurality grooves of the needle and the plurality of grooves of the radial flow guide are equal in number and the plurality of grooves of the needle are rotationally aligned with the plurality of grooves of the radial flow guide;
  wherein the needle further comprises an annulus, the annulus extending radially from the cylindrical portion, the annulus comprising a face seal configured to engage the seat; and
  wherein the seat is configured to seal against both the cylindrical portion and the face seal when the closure member is in the closed state.

23. A valve assembly for use with a system for processing articles, the valve assembly comprising:
  a body, comprising:
    an inlet;
    an outlet; and
    a flow path extending between the inlet and the outlet;
  a seat located in the flow path;

a closure member, comprising:
  a diaphragm; and
  a needle, comprising:
    a top end;
    a bottom end;
    a cylindrical portion;
    a grooved portion intermediate the bottom end and the cylindrical portion, wherein the grooved portion comprises a plurality of grooves; and
    an annulus extending radially from the cylindrical portion, wherein the annulus comprises a face seal configured to engage the seat; and
  an actuator coupled to the closure member, wherein the actuator is operable to move the closure member from a closed state in which the cylindrical portion and the face seal sealingly engage the seat and obstruct the flow path to an open state which permits fluid flow through the flow path; and
  a radial flow guide comprising a plurality of grooves, wherein the plurality grooves of the needle are rotationally aligned with the plurality of grooves of the radial flow guide.

* * * * *